(12) United States Patent
Nishiyama

(10) Patent No.: US 10,857,570 B2
(45) Date of Patent: Dec. 8, 2020

(54) SUBSTRATE PROCESSING APPARATUS

(71) Applicant: SCREEN Holdings Co., Ltd., Kyoto (JP)

(72) Inventor: Koji Nishiyama, Kyoto (JP)

(73) Assignee: SCREEN Holding Co., Ltd. (JP)

( * ) Notice: Subject to any disclaimer, the term of this patent is extended or adjusted under 35 U.S.C. 154(b) by 0 days.

(21) Appl. No.: 15/041,125

(22) Filed: Feb. 11, 2016

(65) Prior Publication Data

US 2016/0236239 A1   Aug. 18, 2016

(30) Foreign Application Priority Data

Feb. 16, 2015 (JP) .................................. 2015-027903

(51) Int. Cl.
   *B08B 1/00* (2006.01)
   *B08B 7/04* (2006.01)
   *B08B 1/04* (2006.01)
   *H01L 21/67* (2006.01)

(52) U.S. Cl.
   CPC ............... *B08B 1/002* (2013.01); *B08B 1/04* (2013.01); *H01L 21/67046* (2013.01)

(58) Field of Classification Search
   CPC ...................... H01L 21/0209; H01L 21/02087
   USPC .............................. 15/77, 88.3; 134/137, 157
   See application file for complete search history.

(56) References Cited

U.S. PATENT DOCUMENTS

| 4,141,180 A | * | 2/1979 | Gill, Jr. .................. B24B 37/30 |
| | | | 451/276 |
| 5,591,262 A | | 1/1997 | Sago et al. ...................... 118/52 |
| 6,257,966 B1 | * | 7/2001 | Ishikawa ............... B24B 37/345 |
| | | | 451/279 |
| 8,166,985 B2 | * | 5/2012 | Nishiyama ........ H01L 21/67046 |
| | | | 134/137 |

(Continued)

FOREIGN PATENT DOCUMENTS

| JP | 63-155622 A | 6/1988 |
| JP | 07-256195 A | 10/1995 |

(Continued)

OTHER PUBLICATIONS

Decision to Grant a Patent dated Aug. 30, 2017 in the counterpart Korean Patent Application No. 10-2016-0016339.

(Continued)

*Primary Examiner* — Dung Van Nguyen
(74) *Attorney, Agent, or Firm* — Ostrolenk Faber LLP

(57) ABSTRACT

An upper spin chuck and a lower spin chuck are arranged in a vertical direction. In the lower spin chuck, a substrate holder sucks a center portion of a lower surface of a substrate, so that the substrate is held. In this state, a peripheral portion of the lower surface of the substrate rotated by a spin motor is cleaned by a brush of a first back surface cleaning mechanism. In the upper spin chuck, a plurality of chuck pins abut against an outer peripheral end of the substrate, so that the substrate is held. In this state, a region inward of the peripheral portion of the lower surface of the substrate rotated by the spin motor is cleaned by a (Continued)

brush of a second back surface cleaning mechanism. Receiving and transferring of the substrate are performed by a receiving transferring mechanism between the upper and the lower spin chucks.

9 Claims, 14 Drawing Sheets

(56) References Cited

U.S. PATENT DOCUMENTS

| | | | |
|---|---|---|---|
| 2008/0163899 A1* | 7/2008 | Takiguchi | H01L 21/67028 134/30 |
| 2009/0120472 A1 | 5/2009 | Nishiyama et al. | 134/157 |
| 2012/0014689 A1 | 1/2012 | Ookouchi et al. | 396/611 |
| 2015/0027492 A1* | 1/2015 | Takiguchi | H01L 21/67051 134/6 |

FOREIGN PATENT DOCUMENTS

| | | | |
|---|---|---|---|
| JP | 07-297159 | | 11/1995 |
| JP | 2002-001254 | | 1/2002 |
| JP | 2002001254 A | * | 1/2002 |
| JP | 2003-282515 A | | 10/2003 |
| JP | 2006-269974 A | | 10/2006 |
| JP | 2009-123800 | | 6/2009 |
| JP | 2012-023209 A | | 2/2012 |
| JP | 2015-023248 A | | 2/2015 |
| KR | 10-2010-0132915 A | | 12/2010 |

OTHER PUBLICATIONS

Notice of Reasons for Refusal dated Aug. 21, 2018 in corresponding Japanese Patent Application No. 2015-027903.

* cited by examiner

F I G. 2 0
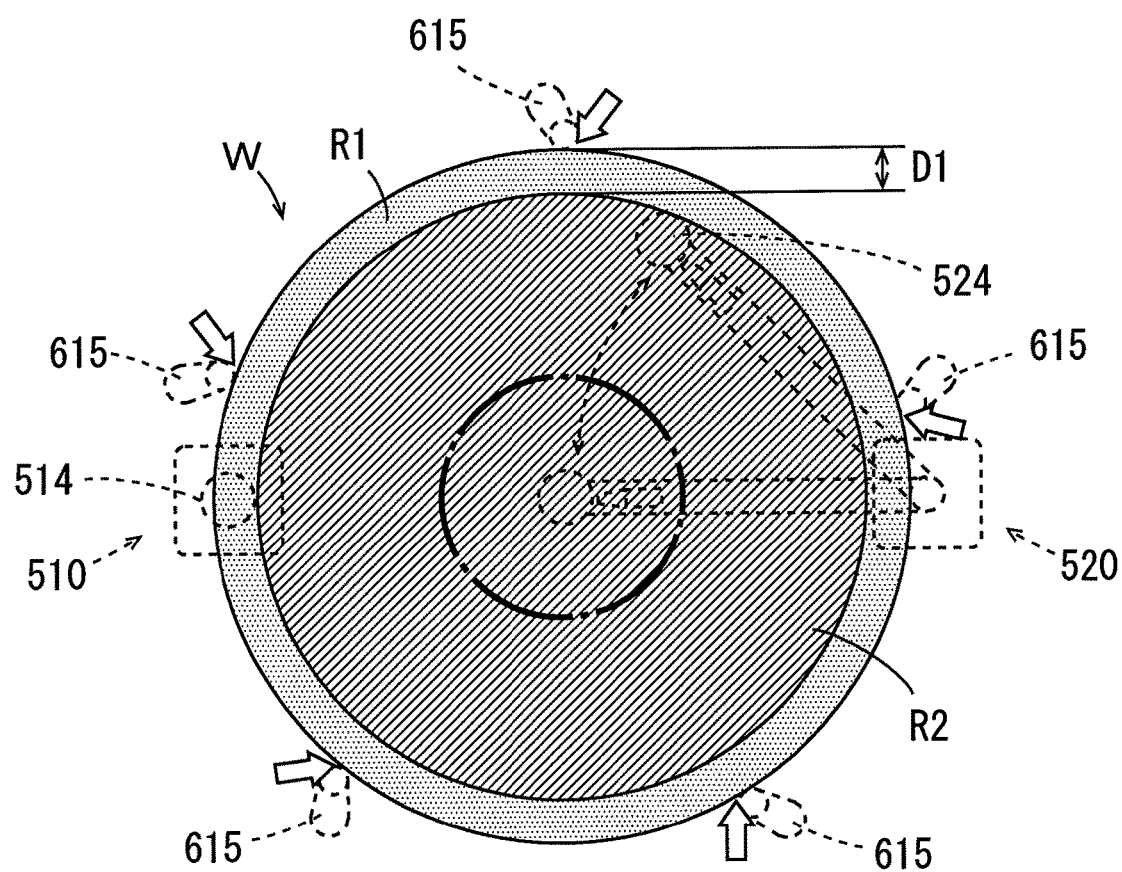

SUBSTRATE PROCESSING APPARATUS

BACKGROUND OF THE INVENTION

1. Field of the Invention

The present invention relates to a substrate processing apparatus.

2. Description of Related Art

Substrate processing apparatuses are used to subject various types of substrates such as semiconductor substrates, substrates for liquid crystal displays, substrates for plasma displays, substrates for optical discs, substrates for magnetic discs, substrates for magneto-optical discs, and substrates for photomasks, and other substrates to various types of processing. In such a substrate processing apparatus, cleaning processing for the substrate is performed with the substrate being held by a spin chuck, for example. An example of the spin chuck includes an edge holding type spin chuck that holds an outer peripheral end of the substrate.

A spin chuck described in JP 2009-123800 A is mainly constituted by a spin motor, a spin plate and a plurality of chuck pins. A rotation shaft is provided to extend downward from inside of the spin motor, and the spin plate is attached to the lower end of the rotation shaft. The plurality of substantially columnar chuck pins are provided at a peripheral portion of the spin plate at equal intervals with respect to the rotation shaft to extend downward of the spin plate.

Each of the plurality of chuck pins is configured to be switchable between a close state of abutting against an outer peripheral end of the substrate and an open state of spacing apart from the outer peripheral end of the substrate. The plurality of chuck pins enter the close state, so that the substrate is held directly downward of the spin plate. The spin plate is rotated about a vertical axis, so that the substrate is rotated in a horizontal attitude. In this state, a lower surface of the substrate is cleaned by a brush.

Further, in the above-mentioned spin chuck, with the substrate being rotated in a horizontal attitude, the chuck pins are switched from the close state to the open state in a partial region that overlaps with the outer peripheral end of the substrate. Thus, the chuck pins are spaced apart from the outer peripheral end of the substrate in the partial region. Thus, the outer peripheral end, of the substrate, passing through the partial region is cleaned by the brush.

BRIEF SUMMARY OF THE INVENTION

As described above, according to the spin chuck described in JP 2009-123800 A, the state of the chuck pins is switched in the partial region, so that a peripheral portion of the lower surface of the substrate and an outer peripheral end of the substrate can be cleaned while the chuck pins and the brush are prevented from interfering with each other.

However, in a case in which the peripheral portion of the lower surface of the substrate is cleaned using the brush, high pressure may be supplied from the brush to the substrate in the partial region depending on a cleaning condition. In this case, part of the chuck pins is in the open state, so that a positional deviation of the substrate occurs. Thus, it is difficult to evenly clean the entire lower surface of the substrate.

An object of the present invention is to provide a substrate processing apparatus capable of evenly cleaning an entire lower surface of a substrate.

(1) According to one aspect of the present invention, a substrate processing apparatus includes a first substrate holding device, a second substrate holding device provided directly upward of the first substrate holding device, a receiving transferring mechanism that receives and transfers a substrate between the first substrate holding device and the second substrate holding device, and first and second cleaning mechanisms that clean a lower surface of the substrate, wherein the first substrate holding device includes a suction holder that is configured to be rotatable about a vertical axis and sucks a center portion of the lower surface of the substrate, and a first rotation driver that rotates the suction holder, the first cleaning mechanism includes a first brush that cleans a peripheral portion of the lower surface of the substrate that is rotated while being held by the suction holder, the second substrate holding device includes a rotation member configured to be rotatable about the vertical axis, a second rotation driver that rotates the rotation member, and an abutment holder that holds the substrate by abutting against an outer peripheral end of the substrate that is arranged directly downward of the rotation member, and the second cleaning mechanism includes a second brush that cleans a region inward of the peripheral portion of the lower surface of the substrate that is rotated while being held by the abutment holder.

In the substrate processing apparatus, the suction holder of the first substrate holding device sucks the center portion of the lower surface of the substrate, so that the substrate is held. In this state, the peripheral portion of the lower surface of the substrate rotated by the first rotation driver is cleaned by the first brush. In this case, a holding position of the substrate by the suction holder and a cleaning position of the substrate by the first brush are spaced apart from each other, so that the suction holder and the first brush do not interfere with each other. Thus, it is not necessary to change the holding position of the substrate in order to prevent the suction holder and the first brush from interfering with each other. Further, a positional deviation of the substrate due to the change of the holding position does not occur either. Therefore, the peripheral portion of the lower surface of the substrate can be evenly cleaned by the first brush.

Further, the abutment holder of the second substrate holding device abuts against the outer peripheral end of the substrate, so that the substrate is held. In this state, a region inward of the peripheral portion of the lower surface of the substrate rotated by the second rotation driver is cleaned by the second brush. In this case, the holding position of the substrate by the abutment holder and the cleaning position of the substrate by the second brush are spaced apart from each other, so that the abutment holder and the second brush do not interfere with each other. Thus, it is not necessary to change the holding position of the substrate in order to prevent the abutment holder and the second brush from interfering with each other. Further, a positional deviation of the substrate due to the change of the holding position does not occur either. Therefore, the region inward of the peripheral portion of the lower surface of the substrate can be evenly cleaned by the second brush.

Receiving and transferring of the substrate are performed by the receiving transferring mechanism between the first substrate holding device and the second substrate holding device. Thus, the entire lower surface of the substrate can be evenly cleaned by the first brush and the second brush.

(2) The first cleaning mechanism may further include a first cleaning liquid supplier that supplies a cleaning liquid to the first brush during cleaning for the peripheral portion of the lower surface using the first brush, and the second cleaning mechanism may further include a second cleaning liquid supplier that supplies the cleaning liquid to the second brush during cleaning for the region inward of the peripheral portion of the lower surface using the second brush.

In this case, a contaminant removed from the peripheral portion of the lower surface of the substrate by the first brush is cleaned away by the cleaning liquid. Further, a contaminant removed from the region inward of the peripheral portion of the lower surface by the second brush is cleaned away by the cleaning liquid. Therefore, re-adherence of the contaminant removed by the first and second brushes to the substrate is prevented. Thus, the cleanliness of the substrate after the cleaning is improved. Further, a reduction in cleanliness of the first and second brushes is inhibited.

(3) The substrate processing apparatus may further include a controller that controls the first substrate holding device, the second substrate holding device, the first cleaning mechanism, the second cleaning mechanism and the receiving transferring mechanism, wherein the controller may control the first rotation driver such that the suction holder is rotated during cleaning for the lower surface of the substrate by the second cleaning mechanism.

In the above-mentioned configuration, in a case in which the lower surface of the substrate is cleaned by the second cleaning mechanism with the substrate being held by the second substrate holding device, the contaminant removed by the second brush falls on the suction holder of the first substrate holding device. At this time, the suction holder is rotated, so that the contaminant that falls on the suction holder is shaken off from the suction holder by a centrifugal force. As a result, adherence of the contaminant to the suction holder is inhibited.

(4) The first rotation driver may include a hollow rotation shaft provided to extend upward, the suction holder has a suction path and may be attached to an upper end of the rotation shaft, and the suction path may be formed to obliquely extend upward from an inner space of the rotation shaft and be open to an upper surface of the suction holder.

According to such a configuration, even if foreign matter such as moisture or a contaminant enter the suction path from an opening on the upper surface of the suction holder during cleaning for the substrate by the second cleaning mechanism, the suction holder is rotated, so that the foreign matter is discharged from the suction path by a centrifugal force. Therefore, an entrance of the foreign matter into the first rotation driver is prevented.

(5) The substrate processing apparatus may further include a third cleaning mechanism that has a third brush and cleans an upper surface of the suction holder by the third brush.

In this case, the contaminant adhering to the upper surface of the suction holder is removed by the third brush. Therefore, transfer of the contaminant from the suction holder to the center portion of the lower surface of the substrate is prevented.

(6) The substrate processing apparatus may further include a fourth cleaning mechanism that has a third cleaning liquid supplier and supplies a cleaning liquid to an upper surface of the suction holder from the third cleaning liquid supplier.

In this case, the contaminant adhering to the upper surface of the suction holder is cleaned away by the cleaning liquid supplied from the third cleaning liquid supplier. Therefore, transfer of the contaminant from the suction holder to the center portion of the lower surface of the substrate is prevented.

(7) The receiving transferring mechanism may include a receiving transferring supporter configured to be movable in a vertical direction between the first substrate holding device and the second substrate holding device while supporting the substrate, the receiving transferring supporter may have an upper end that supports the substrate by abutting against a region between the center portion of the lower surface and the peripheral portion of the lower surface of the substrate, and the substrate processing apparatus may further include a gas injection device that injects gas to the upper end of the receiving transferring supporter at a position directly downward of the second substrate holding device during cleaning for the lower surface of the substrate by the second cleaning mechanism.

In the above-mentioned configuration, in a case in which the lower surface of the substrate is cleaned by the second cleaning mechanism with the substrate being held by the second substrate holding device, the contaminant removed by the second brush falls on the upper end of the receiving transferring supporter. At this time, the gas is injected to the upper end of the receiving transferring supporter, so that the contaminant that falls on the upper end of the receiving transferring supporter is blown away by the gas. As a result, transfer of the contaminant from the upper end of the receiving transferring supporter to the lower surface of the substrate is prevented.

(8) The first brush may be configured to be capable of cleaning an outer peripheral end by coming into contact with the outer peripheral end of the substrate that is rotated while being held by the first substrate holding device.

In this case, with the substrate being held by the first substrate holding device, the outer peripheral end of the substrate is cleaned by the first brush in addition to the peripheral portion of the lower surface of the substrate. Thus, it is possible to simultaneously clean the peripheral portion of the lower surface and the outer peripheral end of the substrate without providing another brush.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 20 is a plan view showing a relationship between a holding position and a cleaning position of the substrate in the cleaning drying processing unit.

DESCRIPTION OF THE PREFERRED EMBODIMENTS

A substrate processing apparatus according to one embodiment of the present invention will be described below with reference to drawings. In the following description, a substrate refers to a semiconductor substrate, a substrate for a liquid crystal display, a substrate for a plasma display, a substrate for an optical disc, a substrate for a magnetic disc, a substrate for a magneto-optical disc, a substrate for a photomask or the like.

(1) Configurations of Substrate Processing Apparatus

Figure 1:
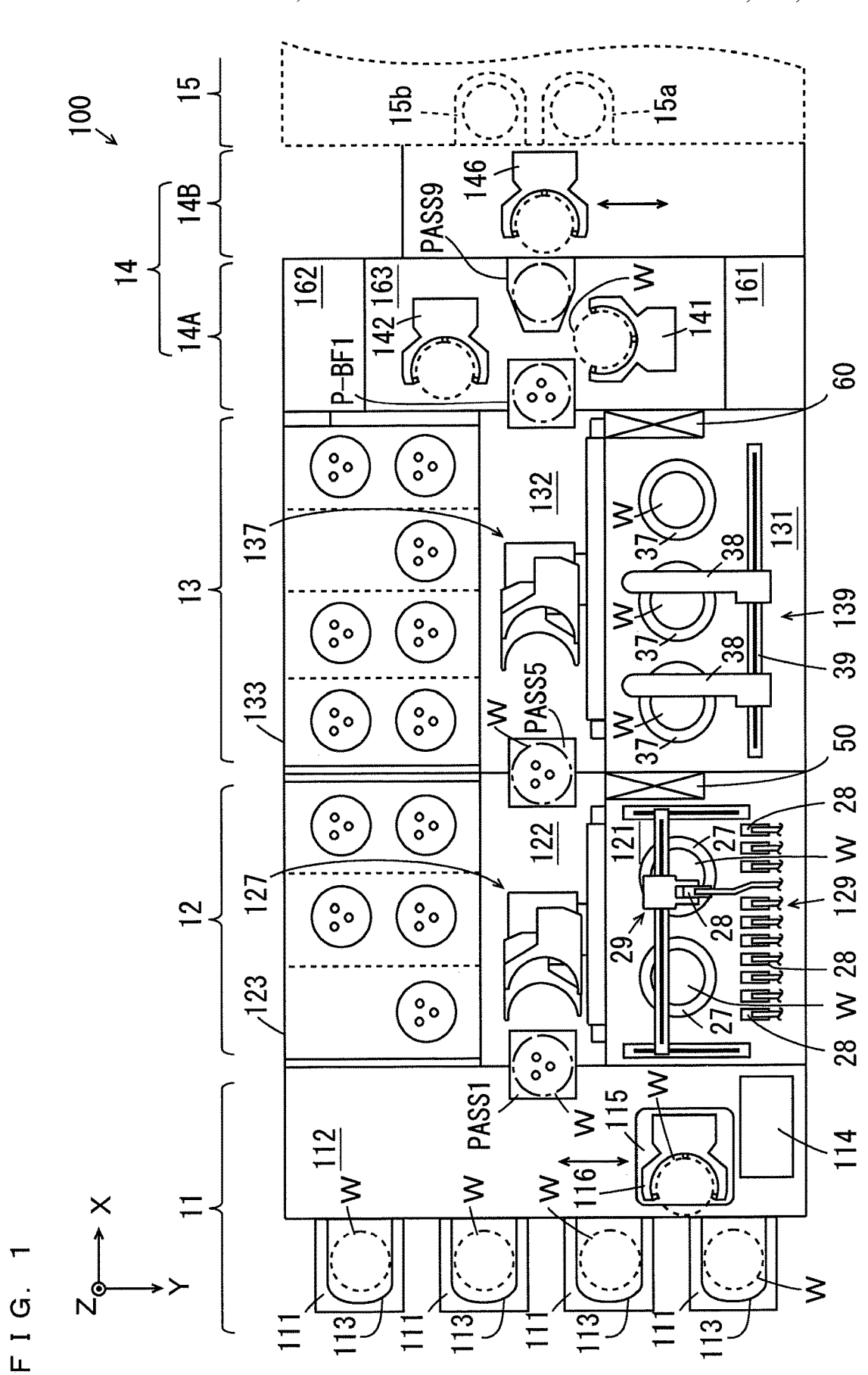
FIG. 1 is a schematic plan view of a substrate processing apparatus according to one embodiment of the present invention.

FIG. 1 is a schematic plan view of the substrate processing apparatus according to one embodiment of the present invention.

FIG. 1 and the subsequent drawings are accompanied by the arrows that indicate X, Y, and Z directions orthogonal to one another for the clarity of a positional relationship. The X and Y directions are orthogonal to each other within a horizontal plane and the Z direction is equivalent to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

As shown in FIG. 1, the indexer block 11 includes a plurality of carrier platforms 111 and a transport section 112.

In each carrier platform 111, a carrier 113 for storing the plurality of substrates W in multiple stages is placed.

A controller 114 and a transport mechanism 115 are provided in the transport section 112. The controller 114 controls various constituent elements of the substrate processing apparatus 100. The transport mechanism 115 has a hand 116 for holding the substrate W. The transport mechanism 115 holds the substrate W by the hand 116 and transports the substrate W.

The first processing block 12 includes a coating processing section 121, a transport section 122 and a thermal processing section 123. The coating processing section 121 and the thermal processing section 123 are provided to be opposite to each other with the transport section 122 sandwiched therebetween. Substrate platform PASS1, and substrate platforms PASS2 to PASS4 (see FIG. 4), described below, on which the substrates W are placed are provided between the transport section 122 and the indexer block 11. A transport mechanism 127 and a transport mechanism 128 (see FIG. 4) that is described below, which transport the substrates W, are provided in the transport section 122.

The second processing block 13 includes a coating development processing section 131, a transport section 132 and a thermal processing section 133. The coating development processing section 131 and the thermal processing section 133 are provided to be opposite to each other with the transport section 132 sandwiched therebetween. Substrate platform PASS5, and substrate platforms PASS6 to PASS8 (see FIG. 4), described below, on which the substrates W are placed are provided between the transport section 132 and the transport section 122. A transport mechanism 137 and a transport mechanism 138 (see FIG. 4) that is described below, which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 sandwiched therebetween. Transport mechanisms 141, 142 are provided in the transport section 163.

A placement buffer unit P-BF1 and a placement buffer unit P-BF2 (see FIG. 4) that is described below are provided between the transport section 163 and the transport section 132.

Further, a substrate platform PASS9 and placement cooling platforms P-CP (see FIG. 4) that are described below are provided to be adjacent to the carry-in carry-out block 14B between the transport mechanisms 141, 142. In the placement cooling platform P-CP, the substrate W is cooled to a temperature suitable for the exposure processing.

A transport mechanism 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided in the exposure device 15.

Figure 2:
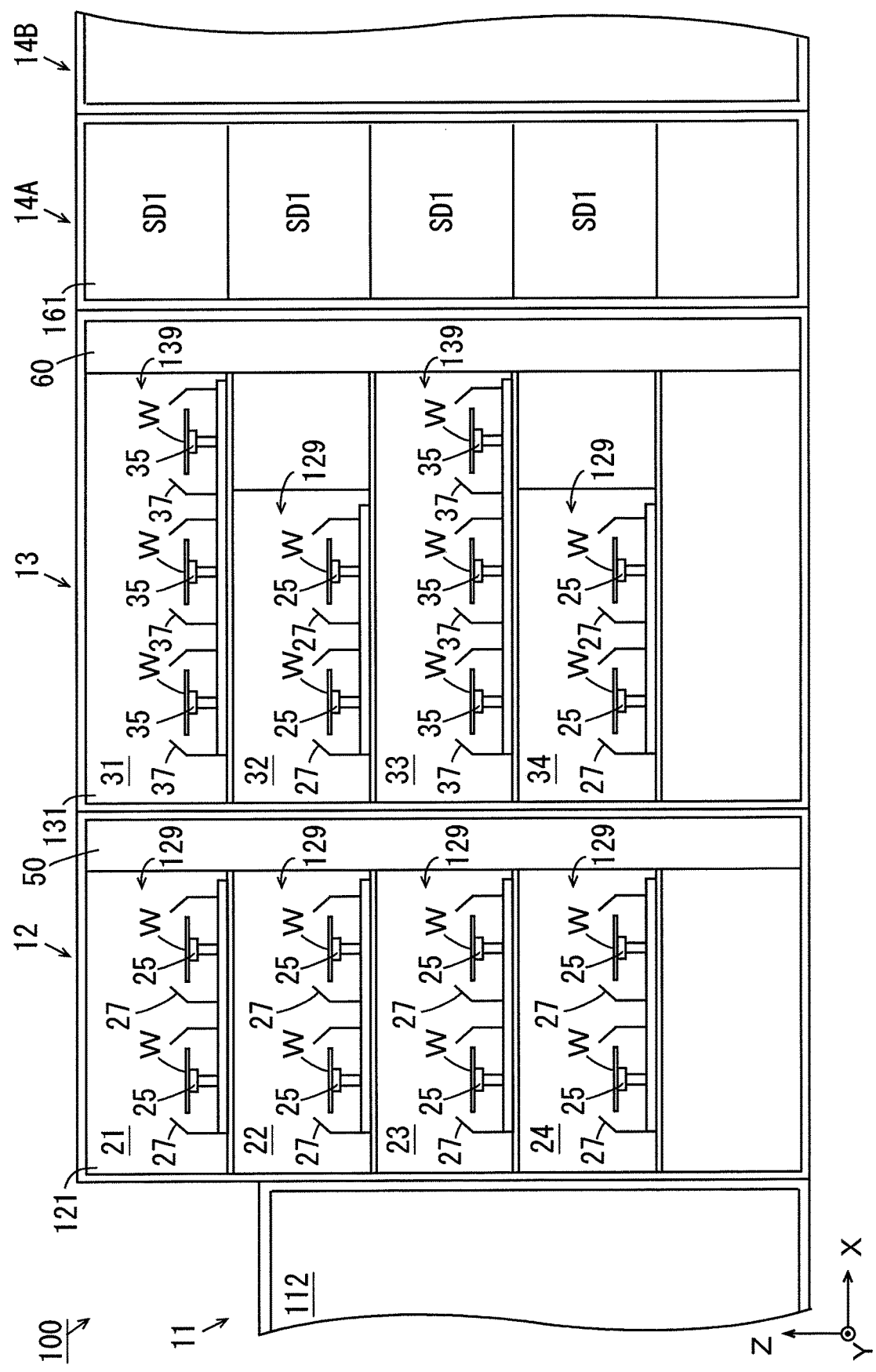
FIG. 2 is a schematic side view of the substrate processing apparatus mainly showing a coating processing section, a coating development processing section and a cleaning drying processing section of FIG. 1.

(2) Configurations of Coating Processing Section and Coating Development Processing Section FIG. 2 is a schematic side view of the substrate processing apparatus 100 mainly showing the coating processing section 121, the coating development processing section 131 and the cleaning drying processing section 161 of FIG. 1.

As shown in FIG. 2, in the coating processing section 121, coating processing chambers 21, 22, 23, 24 are provided in a stack. In each of the coating processing chambers 21 to 24, a coating processing unit 129 is provided. In the coating development processing section 131, development processing chambers 31, 33 and coating processing chambers 32, 34 are provided in a stack. A development processing unit 139 is provided in each of the development processing chambers 31, 33, and the coating processing unit 129 is provided in each of the coating processing chambers 32, 34.

Each coating processing unit 129 includes spin chucks 25 that hold the substrates W and cups 27 provided to cover the surroundings of the spin chucks 25. In the present embodiment, two pairs of the spin chucks 25 and the cups 27 are provided in each coating processing unit 129. Each spin chuck 25 is driven to be rotated by a driving device that is not shown (an electric motor, for example). Further, as shown in FIG. 1, each coating processing unit 129 includes a plurality of processing liquid nozzles 28 that discharge a processing liquid and a nozzle transport mechanism 29 that transports these processing liquid nozzles 28.

In the coating processing unit 129, the spin chuck 25 is rotated by the driving device (not shown), any one of the plurality of processing liquid nozzles 28 is moved to a position directly upward of the substrate W by the nozzle transport mechanism 29, and the processing liquid is discharged from the processing liquid nozzle 28. Thus, the processing liquid is applied to an upper surface of the substrate W. Further, a rinse liquid is discharged at a peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Each development processing unit 139 includes spin chucks 35 and cups 37 similarly to the coating processing unit 129. Further, as shown in FIG. 1, the development processing unit 139 includes two development nozzles 38 that discharge a development liquid and a moving mechanism 39 that moves the development nozzles 38 in the X direction.

In the development processing unit 139, the spin chuck 35 is rotated by the driving device (not shown) and the one development nozzle 38 supplies the development liquid to each substrate W while moving in the X direction. Thereafter, the other development nozzle 38 supplies the development liquid to each substrate W while moving. In this case, the development liquid is supplied to the substrate W, so that development processing for the substrate W is performed. Further, in the present embodiment, development liquids that are different from each other are discharged from the two development nozzles 38. Thus, two types of the development liquids can be supplied to each substrate W.

A plurality (four in the present example) of cleaning drying processing units SD1 are provided in the cleaning drying processing section 161. In each cleaning drying processing unit SD1, cleaning and drying processing for the substrate W before the exposure processing are performed. Details of the cleaning drying processing unit SD1 will be described below.

As shown in FIGS. 1 and 2, a fluid box 50 is provided in the coating processing section 121 to be adjacent to the coating development processing section 131. Similarly, a fluid box 60 is provided in the coating development processing section 131 to be adjacent to the cleaning drying processing block 14A. The fluid box 50 and the fluid box 60 each house fluid related elements such as pipes, joints, valves, flowmeters, regulators, pumps and temperature adjusters used to supply a chemical liquid to the coating processing units 129 and the development processing units 139, discharge the liquid and air out of the coating processing units 129 and the development processing units 139 and the like.

(3) Configurations of Thermal Processing Sections

Figure 3:
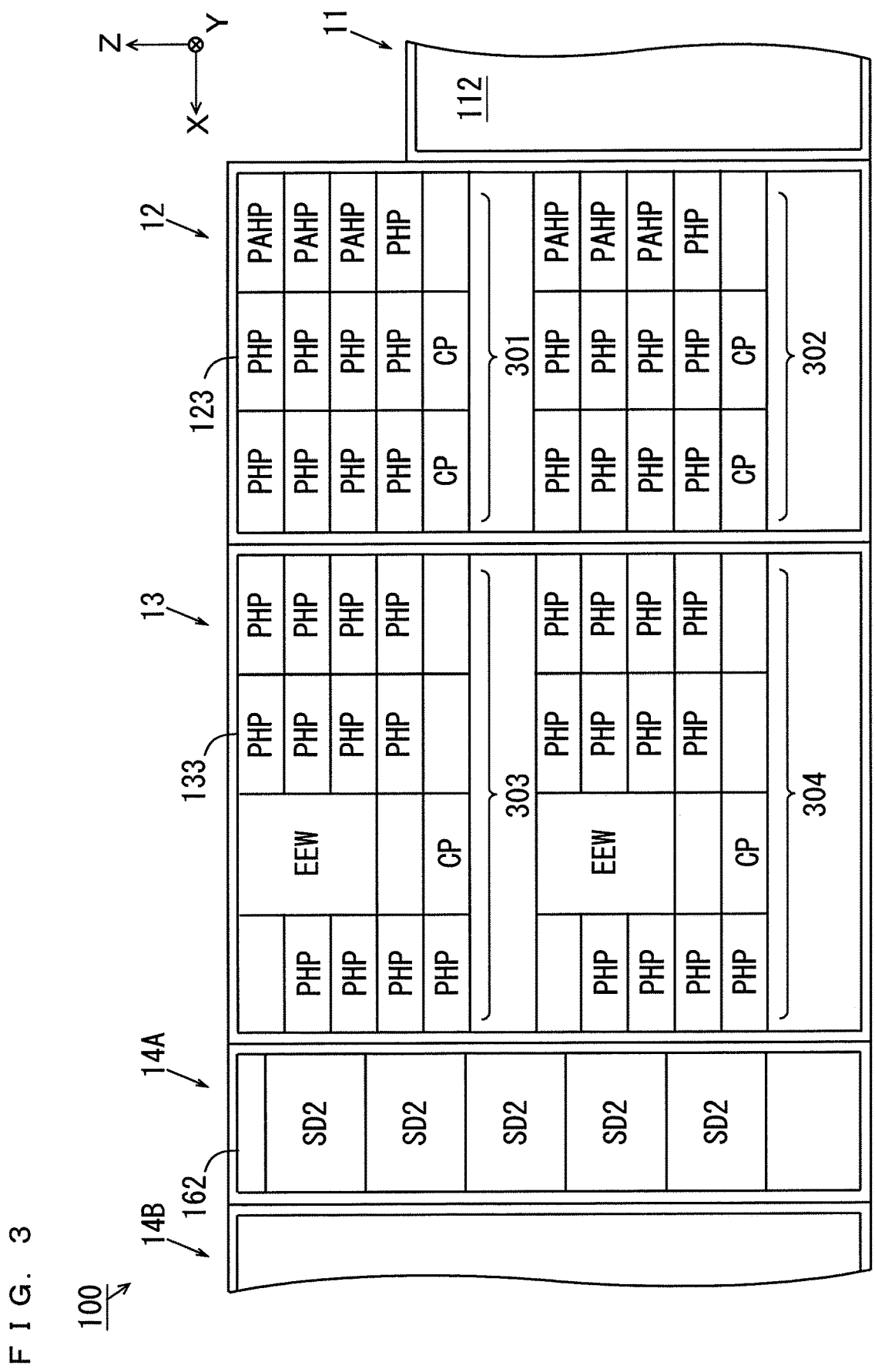
FIG. 3 is a schematic side view of the substrate processing apparatus mainly showing a thermal processing section and a cleaning drying processing section of FIG. 1.

FIG. 3 is a schematic side view of the substrate processing apparatus 100 mainly showing the thermal processing sections 123, 133 and the cleaning drying processing section 162 of FIG. 1. As shown in FIG. 3, the thermal processing section 123 has an upper thermal processing section 301 provided above, and a lower thermal processing section 302 provided below. In each of the upper thermal processing section 301 and the lower thermal processing section 302, a plurality of thermal processing units PHP, a plurality of adhesion reinforcement processing units PAHP and a plurality of cooling units CP are provided.

In each thermal processing unit PHP, heating processing for the substrate W is performed. In the adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. In each of the upper thermal processing section 303 and the lower thermal processing section 304, a cooling unit CP, a plurality of thermal processing units PHP and an edge exposure unit EEW are provided.

In the edge exposure unit EEW, exposure processing (edge exposure processing) is performed on a region with a constant width at the peripheral portion of the resist film formed on the substrate W. In the upper thermal processing section 303 and the lower thermal processing section 304, each thermal processing unit PHP provided to be adjacent to the cleaning drying processing block 14A is configured to be capable of carrying in the substrate W from the cleaning drying processing block 14A.

A plurality (five in the present example) of cleaning drying processing units SD2 are provided in the cleaning drying processing section 162. The cleaning drying processing unit SD2 has the same configurations as the cleaning drying processing unit SD1. In each cleaning drying processing unit SD2, the cleaning and drying processing for the substrate W after the exposure processing are performed.

(4) Configurations of Transport Sections

Figure 4:
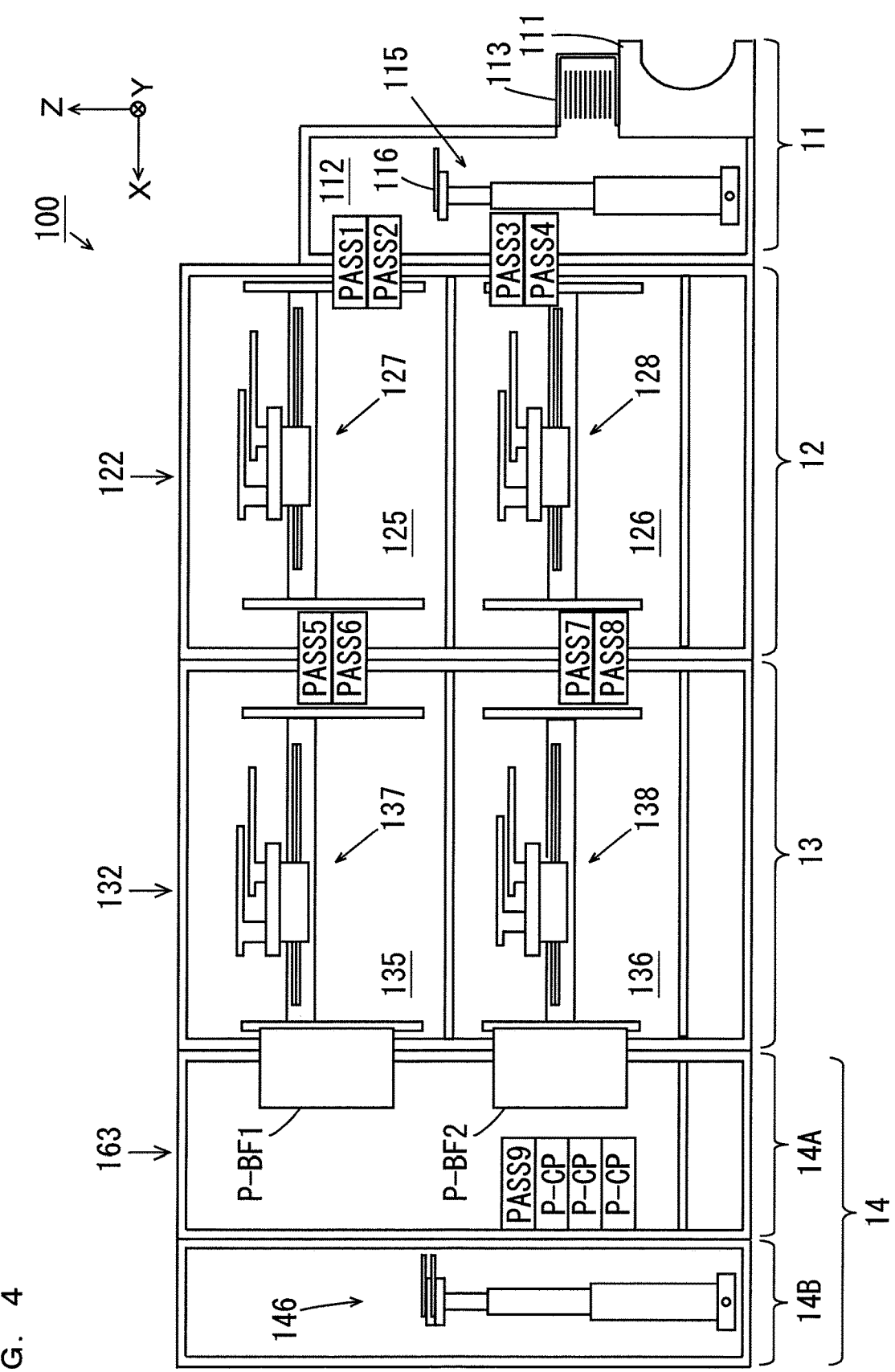
FIG. 4 is a side view mainly showing a transport section of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided to be adjacent to the carry-in carry-out block 14B in the transport section 163.

The transport mechanism 127 is configured to be capable of transporting the substrate W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrate W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASS6, the placement buffer unit P-BF1, the development processing chamber 31 (FIG. 2), the coating processing chamber 32 (FIG. 2) and the upper thermal processing section 303 (FIG. 3). The transport mechanism 138 is configured to be capable of transporting the substrate W among the substrate platforms PASS7, PASS8, the placement buffer unit P-BF2, the development processing chamber 33 (FIG. 2), the coating processing chamber 34 (FIG. 2) and the lower thermal processing section 304 (FIG. 3).

The transport mechanism 141 of the transport section 163 (FIG. 1) is configured to be capable of transporting the substrate W among the placement cooling platforms P-CP, the substrate platform PASS9, the placement buffer units P-BF1, P-BF2 and the cleaning drying processing section 161 (FIG. 2).

The transport mechanism 142 of the transport section 163 (FIG. 1) is configured to be capable of transporting the substrate W among the placement cooling platforms P-CP, the substrate platform PASS9, the placement buffer units P-BF1, P-BF2, the cleaning drying processing section 162 (FIG. 3), the upper thermal processing section 303 (FIG. 3) and the lower thermal processing section 304 (FIG. 3).

(5) Operations of Substrate Processing Apparatus

Operations of the substrate processing apparatus 100 will be described with reference to FIGS. 1 to 4. The carrier 113 in which the unprocessed substrates W are stored is placed on the carrier platform 111 in the indexer block 11 (FIG. 1). The transport mechanism 115 transports the unprocessed substrate W from the carrier 113 to each of the substrate platforms PASS1, PASS3 (FIG. 4). Further, the transport mechanism 115 transports the processed substrate W that is placed on each of the substrate platforms PASS2, PASS4 (FIG. 4) to the carrier 113.

In the first processing block 12, the transport mechanism 127 (FIG. 4) sequentially transports the substrate W placed on the substrate platform PASS1 to the adhesion reinforcement processing unit PAHP (FIG. 3), the cooling unit CP (FIG. 3) and the coating processing chamber 22 (FIG. 2). Next, the transport mechanism 127 sequentially transports the substrate W on which the anti-reflection film is formed by the coating processing chamber 22 to the thermal processing unit PHP (FIG. 3), the cooling unit CP (FIG. 3) and the coating processing chamber 21 (FIG. 2). Then, the transport mechanism 127 sequentially transports the substrate W on which the resist film is formed by the coating processing chamber 21 to the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, the anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled to a temperature suitable for the formation of the resist film in the cooling unit CP. Next, in the coating processing chamber 21, the resist film is formed on the substrate W by the coating processing unit 129 (FIG. 2). Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 to the adhesion reinforcement processing unit PAHP (FIG. 3), the cooling unit CP (FIG. 3) and the coating processing chamber 24 (FIG. 2). Then, the transport mechanism 128 sequentially transports the substrate W on which the anti-reflection film is formed by the coating processing chamber 24 to the thermal processing unit PHP (FIG. 3), the cooling unit CP (FIG. 3) and the coating processing chamber 23 (FIG. 2). Subsequently, the transport mechanism 128 sequentially transports the substrate W on which the resist film is formed by the coating processing chamber 23 to the thermal processing unit PHP (FIG. 3) and the substrate platform PASS7 (FIG. 4).

Further, the substrate mechanism 128 (FIG. 4) transports the substrate W after the development processing that is placed on the substrate platform PASS8 (FIG. 4) to the substrate platform PASS4 (FIG. 4). The processing contents for the substrate W in the coating processing chambers 23, 24 (FIG. 2) and the lower thermal processing section 302 (FIG. 3) are similar to the processing contents for the substrate W in the above-mentioned coating processing chambers 21, 22 (FIG. 2) and the upper thermal processing section 301 (FIG. 3).

In the second processing block 13, the transport mechanism 137 (FIG. 4) sequentially transports the substrate W after the resist film formation that is placed on the substrate platform PASS5 to the coating processing chamber 32 (FIG. 2), the thermal processing unit PHP (FIG. 3), the edge exposure unit EEW (FIG. 3) and the placement buffer unit P-BF1 (FIG. 4). In this case, in the coating processing chamber 32, the resist cover film is formed on the substrate W by the coating processing unit 129 (FIG. 2). Thereafter, the thermal processing for the substrate W is performed in the thermal processing unit PHP, and the substrate W is carried into the edge exposure unit EEW. Then, in the edge exposure unit EEW, the edge exposure processing is performed on the substrate W. The substrate W after the edge exposure processing is placed on the placement buffer unit P-BF1.

Further, the transport mechanism 137 (FIG. 4) takes out the substrate W after the exposure processing and the thermal processing from the thermal processing unit PHP (FIG. 3) that is adjacent to the cleaning drying processing block 14A. The transport mechanism 137 sequentially transports the substrate W to the cooling unit CP (FIG. 3), the development processing chamber 31 (FIG. 2), the thermal processing unit PHP (FIG. 3) and the substrate platform PASS6 (FIG. 4).

In this case, after the substrate W is cooled to a temperature suitable for the development processing in the cooling unit CP, the resist cover film is removed and the development processing for the substrate W is performed by the development processing unit 139 in the development processing chamber 31. Thereafter, the thermal processing for the substrate W is performed in the thermal processing unit PHP, and the substrate W is placed on the substrate platform PASS6.

The transport mechanism 138 (FIG. 4) sequentially transports the substrate W after the resist film formation that is placed on the substrate platform PASS7 to the coating processing chamber 34 (FIG. 2), the thermal processing unit PHP (FIG. 3), the edge exposure unit EEW (FIG. 3) and the placement buffer unit P-BF2 (FIG. 4).

Further, the transport mechanism 138 (FIG. 4) takes out the substrate W after the exposure processing and the thermal processing from the thermal processing unit PHP (FIG. 3) that is adjacent to the cleaning drying processing block 14A. The transport mechanism 138 sequentially transports the substrate W to the cooling unit CP (FIG. 3), the development processing chamber 33 (FIG. 2), the thermal processing unit PHP (FIG. 3) and the substrate platform PASS8 (FIG. 4). The processing contents for the substrate W in the development processing chamber 33, the coating processing chamber 34 and the lower thermal processing section 304 are similar to the processing contents for the substrate W in the above-mentioned development processing chamber 31, coating processing chamber 32 (FIG. 2) and upper thermal processing section 303 (FIG. 3).

In the cleaning drying processing block 14A, the transport mechanism 141 (FIG. 1) transports the substrate W that is placed on each of the placement buffer units P-BF1, P-BF2 (FIG. 4) to the cleaning drying processing unit SD1 in the cleaning drying processing section 161 (FIG. 2). Then, the transport mechanism 141 transports the substrate W from the cleaning drying processing unit SD1 to the placement cooling platform P-CP (FIG. 4). In this case, the substrate W is cooled in the placement cooling platform P-CP to a temperature suitable for the exposure processing in the exposure device 15 (FIG. 1) after the cleaning and drying processing for the substrate W are performed in the cleaning drying processing unit SD1.

The transport mechanism 142 (FIG. 1) transports the substrate W after the exposure processing that is placed on the substrate platform PASS9 (FIG. 4) to the cleaning drying processing unit SD2 in the cleaning drying processing section 162 (FIG. 3). Further, the transport mechanism 142 transports the substrate W after the cleaning and drying processing to the thermal processing unit PHP in the upper thermal processing section 303 (FIG. 3) or the thermal processing unit PHP in the lower thermal processing section 304 (FIG. 3) from the cleaning drying processing unit SD2. In this thermal processing unit PHP, post-exposure bake (PEB) processing is performed.

In the carry-in carry-out block 14B, the transport mechanism 146 (FIG. 1) transports the substrate W before the exposure processing that is placed on the placement cooling platform P-CP (FIG. 4) to the substrate inlet 15a of the exposure device 15 (FIG. 1). Further, the transport mechanism 146 (FIG. 1) takes out the substrate W after the exposure processing from the substrate outlet 15b of the exposure device 15 (FIG. 1), and transports the substrate W to the substrate platform PASS9 (FIG. 4).

When the exposure device 15 cannot receive the substrate W, the substrate W before the exposure processing is temporarily stored in each of the placement buffer units P-BF1, P-BF2. Further, when the development processing unit 139 (FIG. 2) in the second processing block 13 cannot receive the substrate W after the exposure processing, the substrate W after the exposure processing is temporarily stored in each of the placement buffer units P-BF1, P-BF2.

In the present embodiment, processing for the substrate W in the coating processing chambers 21, 22, 32, the development processing chamber 31 and the upper thermal processing sections 301, 303 that are provided above, and the processing for the substrate W in the coating processing chambers 23, 24, 34, the development processing chamber 33 and the lower thermal processing sections 302, 304 that are provided below can be concurrently performed. Thus, it is possible to improve throughput without increasing a footprint.

(6) Configurations of Cleaning Drying Processing Unit

In the following description, an upper surface of the substrate W refers to a surface of the substrate W facing upward, and a lower surface of the substrate W refers to a surface of the substrate W facing downward. Further, a surface of the substrate W refers to a surface on which an anti-reflection film, a resist film and a resist cover film are formed (main surface), and a back surface of the substrate W refers to a surface opposite to the surface. Inside of the substrate processing apparatus 100 according to the present embodiment, the above-mentioned various processing is performed on the substrate W with the surface of the substrate W facing upward. Therefore, in the present embodiment, the back surface of the substrate W is equivalent to the lower surface of the present invention.

Figure 5:
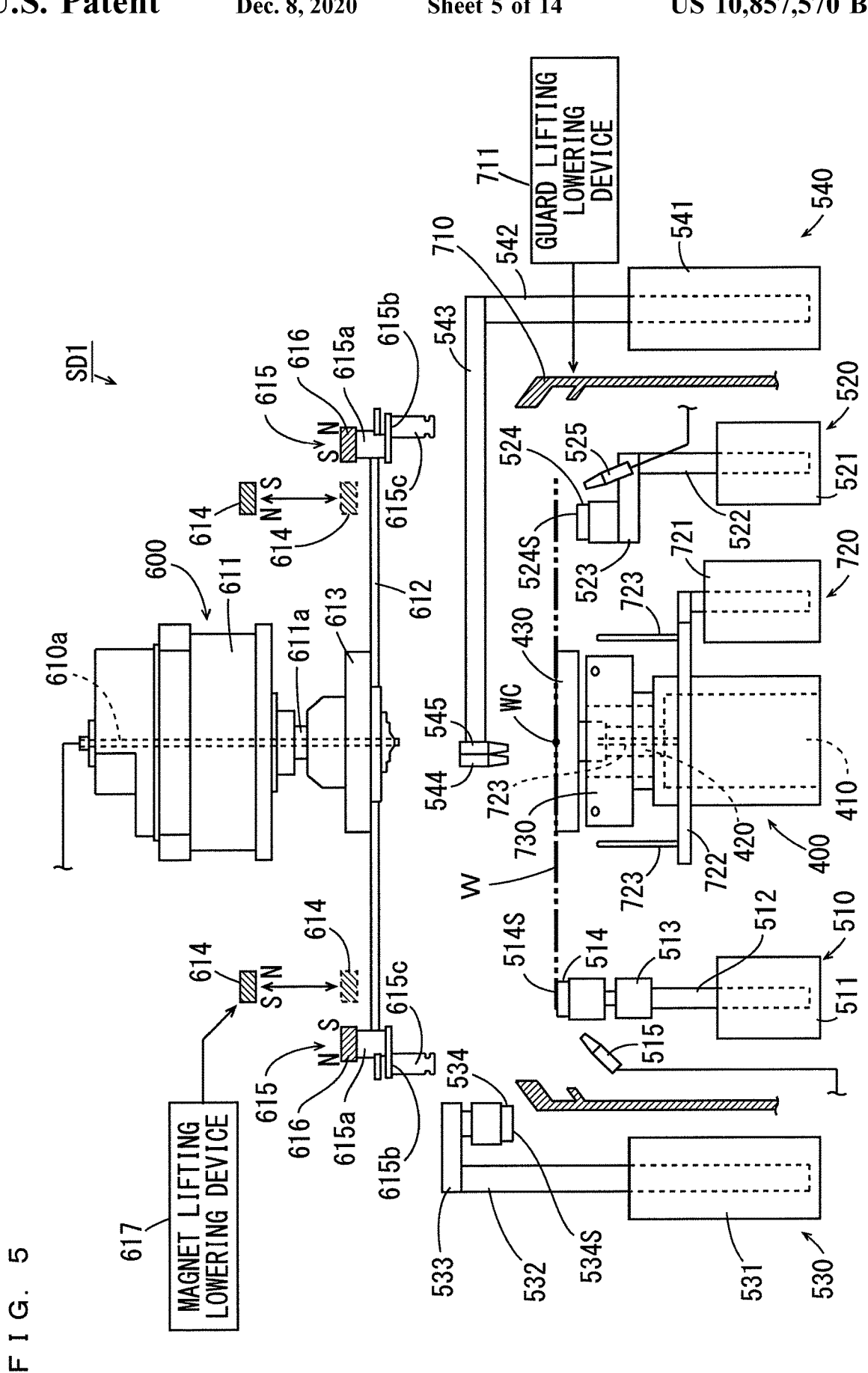
FIG. 5 is a side view showing configurations of the cleaning drying processing unit.
Figure 6:
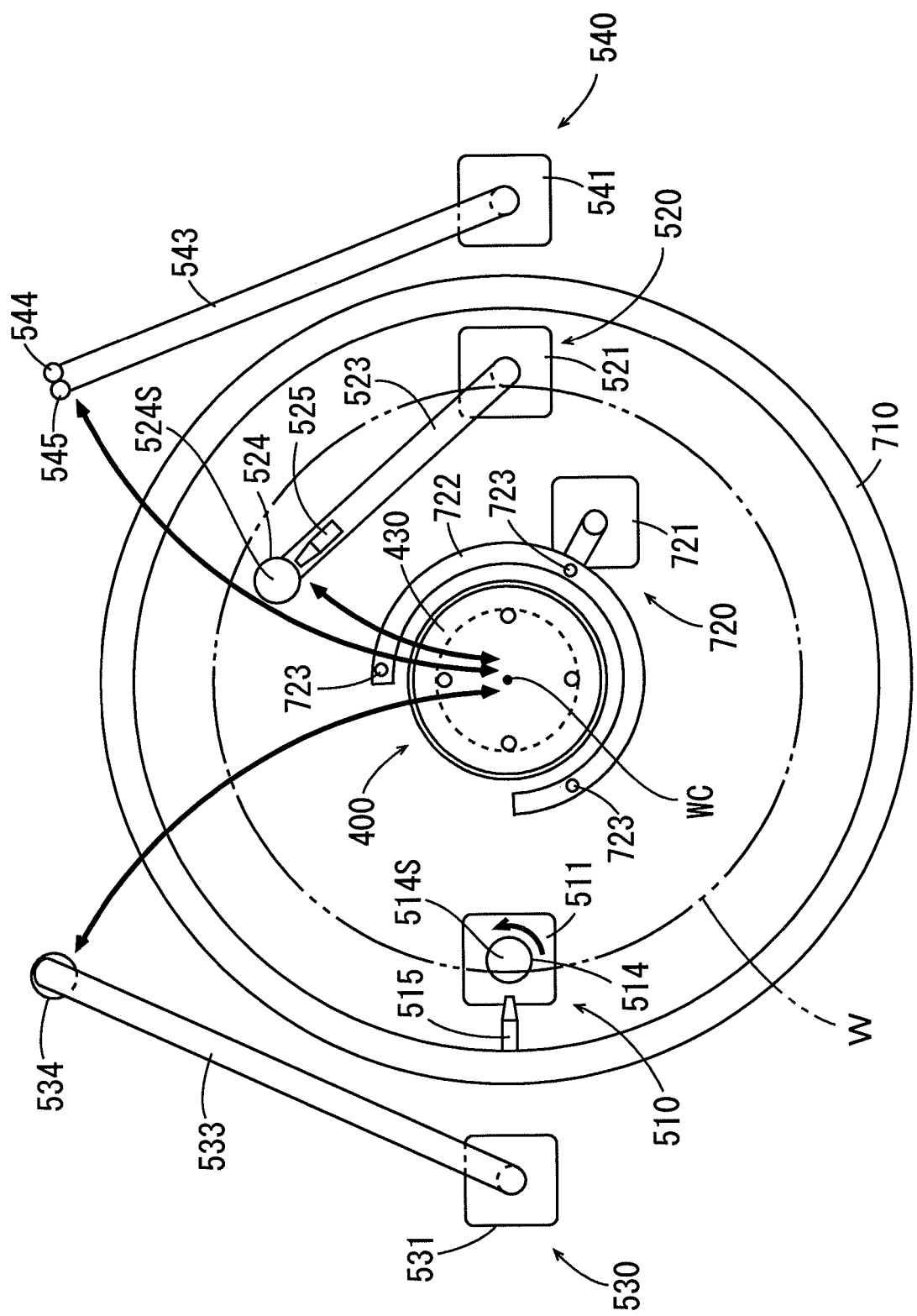
FIG. 6 is a schematic plan view for explaining configurations of a lower spin chuck and its peripheral members that are used in a cleaning drying processing unit of FIG. 5.
Figure 7:
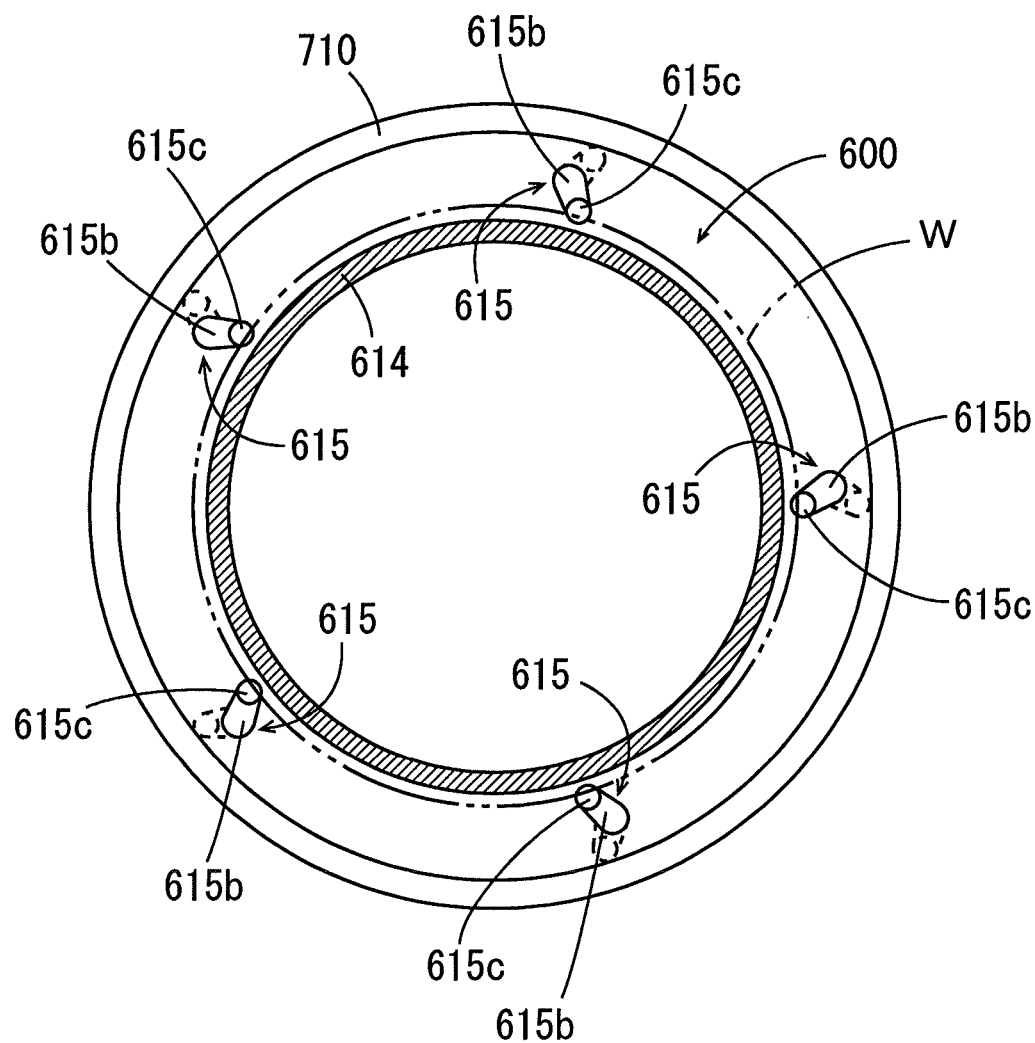
FIG. 7 is a schematic plan view for explaining configurations of an upper spin chuck used in the cleaning drying processing unit of FIG. 5.

FIG. 5 is a side view showing configurations of the cleaning drying processing unit SD1, and FIG. 6 is a schematic plan view for explaining configurations of a lower spin chuck 400 and its peripheral members used for the cleaning drying processing unit SD1 of FIG. 5. In FIGS. 5 and 6, the substrate W held by the spin chuck 400 is indicated by two-dot and dashed lines. FIG. 7 is a schematic plan view for explaining configurations of an upper spin chuck 600 used in the cleaning drying processing unit SD1 of FIG. 5. In FIG. 7, part of the constituent elements of the upper spin chuck 600 is schematically shown, and the substrate W held by the upper spin chuck 600 is indicated by a two-dot and dashed line.

As shown in FIG. 5, the cleaning drying processing unit SD1 includes the lower spin chuck 400 and the upper spin chuck 600. The upper spin chuck 600 is provided directly upward of the lower spin chuck 400.

The lower spin chuck 400 includes a spin motor 410 and a suction holder 430. The spin motor 410 is provided at the bottom of the cleaning drying processing unit SD1, for example. A rotation shaft 420 is provided in the spin motor 410 to extend upward. The suction holder 430 is provided at the upper end of the rotation shaft 420. The suction holder 430 is configured to be capable of sucking a center portion of the back surface of the substrate W. The suction holder 430 sucks the center portion of the back surface of the substrate W, so that the substrate W is held. In the lower spin chuck 400, a gas injection mechanism 730 is provided between the spin motor 410 and the suction holder 430. Details of the lower spin chuck 400 and the gas injection mechanism 730 will be described below.

As shown in FIGS. 5 and 6, a first back surface cleaning mechanism 510, a second back surface cleaning mechanism 520, a spin chuck cleaning mechanism 530, a surface cleaning mechanism 540 and a receiving transferring mechanism 720 are provided outward of the lower spin chuck 400.

The receiving transferring mechanism 720 is arranged to be close to the lower spin chuck 400. The receiving transferring mechanism 720 includes a lifting lowering driver 721, a pin support member 722 and a plurality (three in the present example) of lifting pins 723. The pin support member 722 is attached to the lifting lowering driver 721. The lifting lowering driver 721 supports the pin support member 722 to be movable in the vertical direction. The plurality of lifting pins 723 are respectively attached to the pin support member 722 to extend in the vertical direction. The plurality of lifting pins 723 are arranged to surround the lower spin chuck 400 at equal intervals. The upper ends of the plurality of lifting pins 723 abut against a region between the center portion of the back surface and a peripheral portion of the back surface of the substrate W, so that the substrate W is supported in a horizontal attitude.

The receiving transferring mechanism 720 is controlled by the controller 114 of FIG. 1. The receiving transferring mechanism 720 operates, so that the pin support member 722 is moved in the vertical direction. Thus, the upper ends of the plurality of lifting pins 723 move among three heights L1, L2, L3 (see FIG. 11), described below.

As shown in FIGS. 5 and 6, the first back surface cleaning mechanism 510 includes a lifting lowering driver 511, a lifting lowering shaft 512, a brush motor 513, a brush 514 and a nozzle 515. The lifting lowering shaft 512 is attached to the lifting lowering driver 511 to extend in the vertical direction. The lifting lowering driver 511 supports the lifting lowering shaft 512 to be movable in the vertical direction. The brush motor 513 is provided at the upper end of the lifting lowering shaft 512. The brush 514 is attached to the brush motor 513. The brush motor 513 supports the brush 514 to be rotatable about a vertical axis. The brush 514 has a cleaning surface 514S facing upward.

The lifting lowering driver 511 moves the lifting lowering shaft 512 in the vertical direction. Thus, the height of the brush 514 changes. Further, the brush motor 513 drives the brush 514. Thus, the brush 514 is rotated about the vertical axis. A cleaning liquid supply system (not shown) is connected to the nozzle 515. The nozzle 515 is configured to be capable of discharging a cleaning liquid supplied from the cleaning liquid supply system to the brush 514.

As shown in FIG. 6, when the lower spin chuck 400 is viewed from above, the first back surface cleaning mechanism 510 is arranged such that the cleaning surface 514S of the brush 514 overlaps with the outer peripheral portion and the outer peripheral end of the substrate W held by the lower spin chuck 400. The first back surface cleaning mechanism 510 is controlled by the controller 114 of FIG. 1.

As shown in FIGS. 5 and 6, the second back surface cleaning mechanism 520 includes a lifting lowering rotation driver 521, a lifting lowering rotation shaft 522, an arm 523, a brush 524 and a nozzle 525. The lifting lowering rotation shaft 522 is attached to the lifting lowering rotation driver 521 to extend in the vertical direction. The lifting lowering rotation driver 521 supports the lifting lowering rotation shaft 522 to be movable in the vertical direction and rotatable about a vertical axis. The arm 523 is coupled to the upper end of the lifting lowering rotation shaft 522 to extend in a horizontal direction. The brush 524 is attached to a tip end of the arm 523. The brush 524 has a cleaning surface 524S facing upward.

The lifting lowering rotation driver 521 moves the lifting lowering rotation shaft 522 in the vertical direction. Thus, the height of the brush 524 changes. Further, the lifting lowering rotation driver 521 rotates the lifting lowering rotation shaft 522. Thus, the brush 524 is moved between a position directly upward of a rotational center WC of the suction holder 430 and a position outward of the lower spin chuck 400, for example.

The nozzle 525 is attached to a position in the vicinity of the tip end of the arm 523. The cleaning liquid supply system (not shown) is connected to the nozzle 525. The nozzle 525 is configured to be capable of discharging the cleaning liquid supplied from the cleaning liquid supply system at the brush 524. The second back surface cleaning mechanism 520 is controlled by the controller 114 of FIG. 1.

As shown in FIGS. 5 and 6, the spin chuck cleaning mechanism 530 includes a lifting lowering rotation driver 531, a lifting lowering rotation shaft 532, an arm 533 and a brush 534. The lifting lowering rotation shaft 532 is attached to the lifting lowering rotation driver 531 to extend in the vertical direction. The lifting lowering rotation driver 531 supports the lifting lowering rotation shaft 532 to be movable in the vertical direction and rotatable about a vertical axis. The arm 533 is coupled to the upper end of the lifting lowering rotation shaft 532 to extend in the horizontal direction. The brush 534 is attached to a tip end of the arm 533. The brush 534 has a cleaning surface 534S facing downward.

The lifting lowering rotation driver 531 moves the lifting lowering rotation shaft 532 in the vertical direction. Thus, the height of the brush 534 changes. Further, the lifting lowering rotation driver 531 rotates the lifting lowering rotation shaft 532. Thus, the brush 534 is moved between the rotational center WC of the suction holder 430 and a position outward of the lower spin chuck 400, for example. The spin chuck cleaning mechanism 530 is controlled by the controller 114 of FIG. 1.

As the above-mentioned brushes 514, 524, 534, sponge brushes made of polyvinyl alcohol, for example, are used.

As shown in FIGS. 5 and 6, the surface cleaning mechanism 540 includes a lifting lowering rotation driver 541, a lifting lowering rotation shaft 542, an arm 543 and nozzles 544, 545. The lifting lowering rotation shaft 542 is attached to the lifting lowering rotation driver 541 to extend in the vertical direction. The lifting lowering rotation driver 541 supports the lifting lowering rotation shaft 542 to be movable in the vertical direction and rotatable about a vertical axis. The arm 543 is coupled to the upper end of the lifting lowering rotation shaft 542 to extend in the horizontal direction. The nozzles 544, 545 are attached to a tip end of the arm 543.

The lifting lowering rotation driver 541 moves the lifting lowering rotation shaft 542 in the vertical direction. Thus, the heights of the nozzles 544, 545 change. Further, the lifting lowering rotation driver 541 rotates the lifting lowering rotation shaft 542. Thus, the nozzles 544, 545 are moved between a position directly upward of the rotational center WC of the suction holder 430 and a position outward of the lower spin chuck 400.

The cleaning liquid supply system (not shown) is connected to the nozzle 544. The nozzle 544 is configured to be capable of discharging the cleaning liquid supplied from the cleaning liquid supply system downward. A gas supply system (not shown) is connected to the nozzle 545. The nozzle 545 is configured to be capable of discharging the gas supplied from the gas supply system downward. Here, an inert gas such as a nitrogen gas is used as the gas supplied to the nozzle 545. The surface cleaning mechanism 540 is controlled by the controller 114 of FIG. 1.

As shown in FIGS. 5 and 7, the upper spin chuck 600 includes a spin motor 611, a disc-shape spin plate 612, a plate support member 613, a magnet plate 614 and a plurality of chuck pins 615.

The spin motor 611 is supported by a support member (not shown) at a position directly upward of the lower spin chuck 400. In the spin motor 611, a rotation shaft 611a is provided to extend downward. A plate support member 613 is attached to the lower end of the rotation shaft 611a. The spin plate 612 is horizontally supported by the plate support member 613. The spin motor 611 rotates the rotation shaft 611a. Thus, the spin plate 612 is rotated about a vertical axis. Here, the rotation shaft 611a of the upper spin chuck 600 is arranged on an extending line of the rotation shaft 420 of the lower spin chuck 400.

A liquid supply pipe 610a is inserted into the spin motor 611, the rotation shaft 611a and the plate support member 613. The liquid supply pipe 610a can supply the cleaning liquid to the surface of the substrate W held by the upper spin chuck 600 through the liquid supply pipe 610a.

A plurality (five in the present example) of chuck pins 615 are provided at a peripheral portion of the spin plate 612 at equal angular intervals with respect to the rotation shaft 611a. The number of chuck pins 615 is preferably not less than five.

Each chuck pin 615 includes a shaft portion 615a, a pin supporter 615b, a holder 615c and a magnet 616. The shaft portion 615a is provided to penetrate the spin plate 612, and the pin supporter 615b extending in the horizontal direction is connected to the lower end of the shaft portion 615a. The holder 615c is provided to project downward from a tip end of the pin supporter 615b. Further, the magnet 616 is attached to the upper end of the shaft portion 615a at a position upward of the spin plate 612.

Each chuck pin 615 is rotatable about the shaft portion 615a, and can be switched between a close state in which the holder 615c abuts against the outer peripheral end of the substrate W and an open state in which the holder 615c is spaced apart from the outer peripheral end of the substrate W. In the present example, when an N pole of the magnet 616 is on the inner side, each chuck pin 615 enters the close state. When an S pole of the magnet 616 is on the inner side, each chuck pin 615 enters the open state.

The annular magnet plate 614 is arranged directly upward of the spin plate 612 in a circumferential direction centered at the rotation shaft 611a. The magnet plate 614 has an S pole on the outer side and an N pole on the inner side. The magnet plate 614 is lifted and lowered by a magnet lifting lowering device 617, and is moved between an upper position that is higher than the magnet 616 of each chuck pin 615 and a lower position that is substantially at the equal height as the magnet 616 of each chuck pin 615.

Each chuck pin 615 is switched between the open state and the close state by the lifting and lowering of the magnet plate 614. Specifically, when the magnet plate 614 is at the upper position, each chuck pin 615 enters the open state. On the one hand, when the magnet plate 614 is at the lower position, each chuck pin 615 enters the close state.

A guard 710 for catching the cleaning liquid splashed from the substrate W is provided outward of the upper spin chuck 600, the lower spin chuck 400, the first back surface cleaning mechanism 510, the second back surface cleaning mechanism 520, and the receiving transferring mechanism 720. The guard 710 is shaped to be rotationally-symmetric with respect to the rotation shaft 611a of the upper spin chuck 600 and the rotation shaft 420 of the lower spin chuck 400. Further, the guard 710 is lifted and lowered by a guard lifting lowering device 711. The cleaning liquid that is caught by the guard 710 is discharged or collected by a liquid discharge device or a recovery device (not shown).

In the above-mentioned cleaning drying processing unit SD1, pure water, a pure water solution containing a complex (ionized), or a fluorine-based chemical solution, for example, is used as the cleaning liquid that is discharged from the nozzles 515, 525, 544 and the liquid supply pipe 610a. Further, an immersion liquid that is used for the exposure processing in the exposure device 15 may be used as the cleaning liquid.

Figure 8:
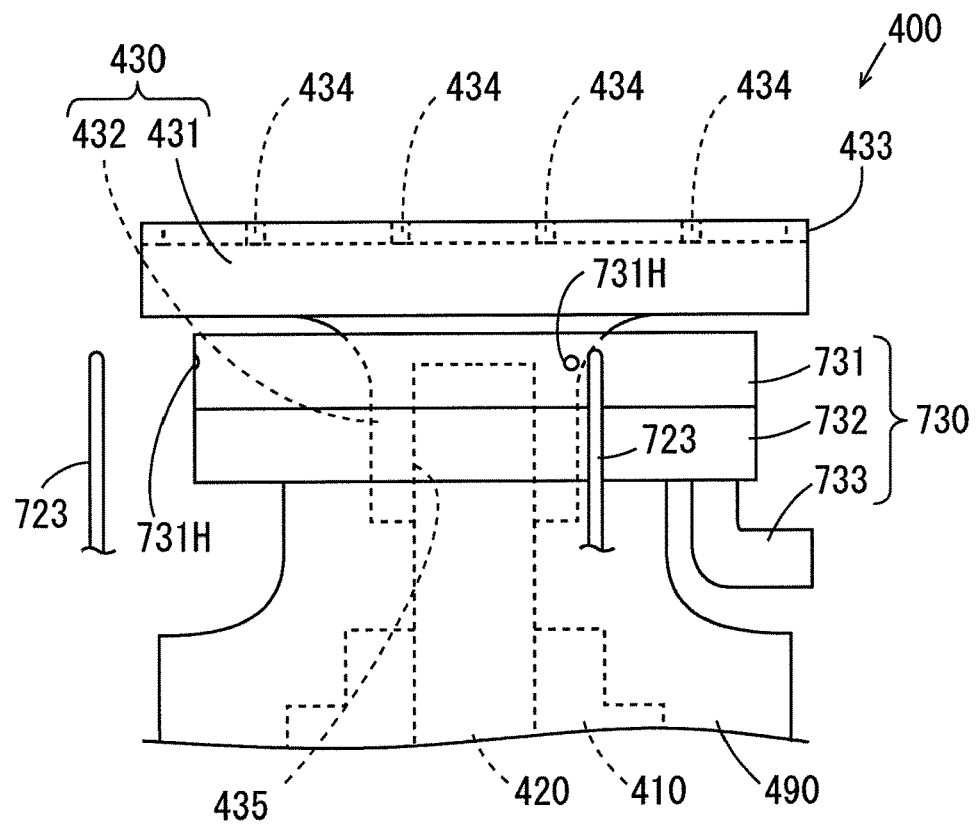
FIG. 8 is a partially enlarged side view of the lower spin chuck.
Figure 9:
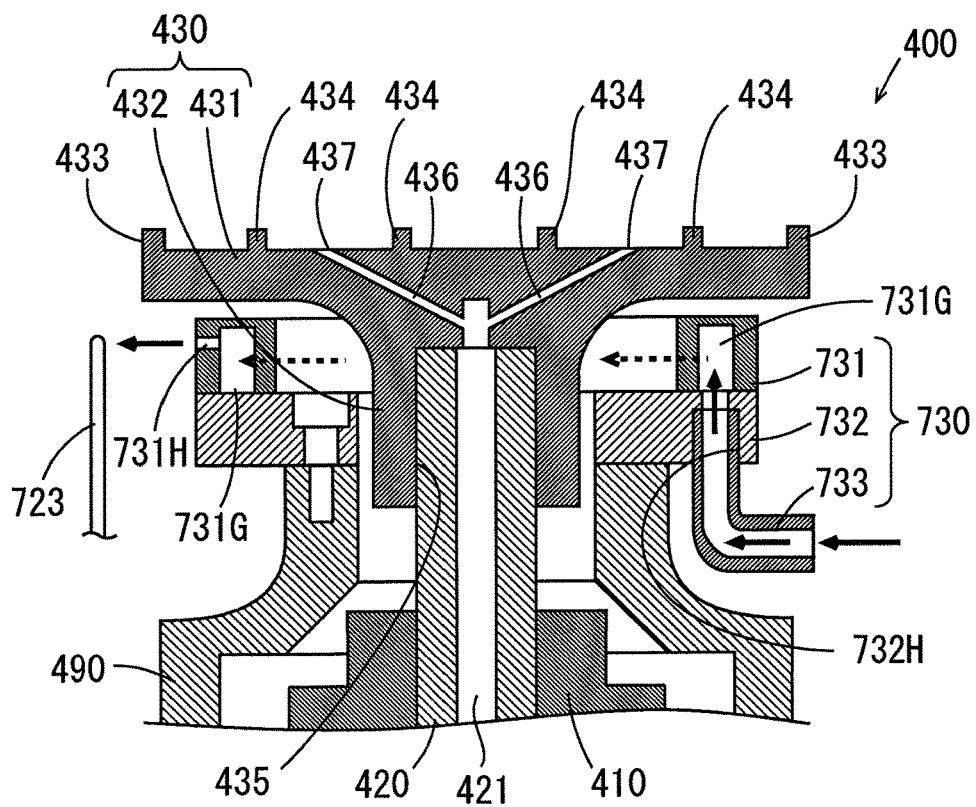
FIG. 9 is a longitudinal cross sectional view of the lower spin chuck of FIG. 8.
Figure 10:
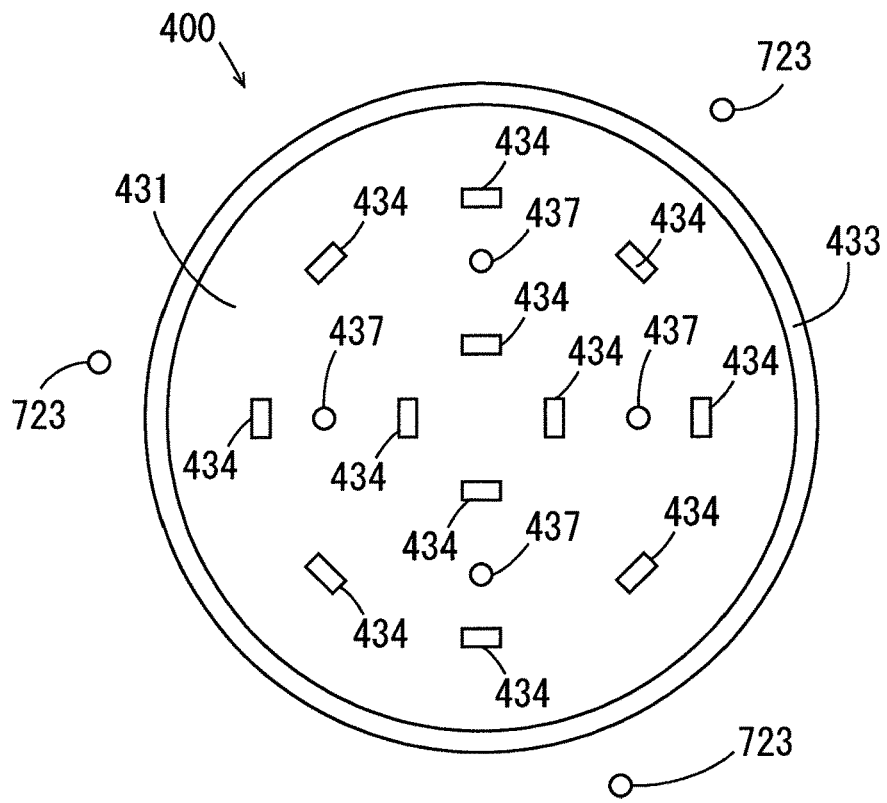
FIG. 10 is a plan view of the lower spin chuck of FIG. 8.

Details of the lower spin chuck 400 and a gas injection mechanism 730 will be described. FIG. 8 is a partially enlarged side view of the lower spin chuck 400, FIG. 9 is a longitudinal cross sectional view of the lower spin chuck 400 of FIG. 8, and FIG. 10 is a plan view of the lower spin chuck 400 of FIG. 8. In FIGS. 8 and 9, the gas injection mechanism 730 of FIG. 5 is shown together with the lower spin chuck 400. Further, in FIGS. 8 to 10, the plurality of lifting pins 723 of FIG. 5 are shown.

As shown in FIG. 8, the suction holder 430 has a disc-plate portion 431 and a shaft portion 432. As shown in FIG. 10, an annular wall portion 433 is formed at an outer peripheral end of an upper surface of the disc-plate portion 431. A plurality (12 in the present example) of projections 434 are provided in a region inward of the annular wall portion 433 of the upper surface of the disc-plate portion 431. The annular wall portion 433 and the plurality of projections 434 support the back surface of the substrate W.

As shown in FIG. 9, the shaft portion 432 is formed to extend downward from a center portion of a lower surface of the disc-plate portion 431. A connection hole 435 is formed in the shaft portion 432. The upper end of the rotation shaft 420 extending from the spin motor 410 is fitted into the connection hole 435.

A hollow shaft is used as the rotation shaft 420. An inner space of the rotation shaft 420 functions as a suction path 421. In the shaft portion 432, a plurality (four in the present example) suction paths 436 that communicate with the suction path 421 of the rotation shaft 420 are formed. Each suction path 436 obliquely extends upward from the upper end of the suction path 421, and opens to the upper surface of the disc-plate portion 431. As shown in FIG. 10, an opening 437 of each suction path 436 is formed at a position spaced apart from the center of the disc-plate portion 431.

For example, the substrate W is placed on the disc-plate portion 431 such that the center of the substrate W is located directly upward of the center axis of the rotation shaft 420. In this state, a center portion, of the back surface of the substrate W, located inward of the annular wall portion 433 is sucked through the suction path 421 and the plurality of suction paths 436 by the suction device (not shown). Thus, the substrate W is held on the suction holder 430.

As shown in FIG. 9, the lower spin chuck 400 further includes a motor cover 490 provided to surround an outer periphery of the spin motor 410. The upper end of the motor cover 490 is located in the vicinity of the lower end of the suction holder 430. The gas injection mechanism 730 is provided at the upper end of the motor cover 490.

The gas injection mechanism 730 includes a first annular member 731, a second annular member 732 and a gas introduction pipe 733. An outer diameter of the first annular member 731 and an outer diameter of the second annular member 732 are equal to each other.

A groove 731G is formed at a lower end surface of the first annular member 731 to extend in the circumferential direction. The lower end surface of the first annular member 731 and the upper end surface of the second annular member 732 are joined to each other to close the groove 731G of the first annular member 731 from below. With the first annular member 731 being joined to the second annular member 732, the second annular member 732 is attached to the upper end of the motor cover 490 using a screw.

A through hole 732H extending from the lower end surface to the upper end surface is formed in the second annular member 732. The through hole 732H is formed such that one end of the gas introduction pipe 733 can be inserted through the through hole 732H. The one end of the gas introduction pipe 733 is inserted into the through hole 732H, so that an inner space of the groove 731G of the first annular member 731 communicates with an inner space of the gas introduction pipe 733.

Here, it is assumed that the upper ends of the plurality of lifting pins 723 are located at heights lower than the upper end of the lower spin chuck 400 by a constant distance. This height is equivalent to the height L1 (FIG. 11), described below. In this state, a plurality of injection holes 731H respectively corresponding to the upper ends of the plurality of lifting pins 723 are formed in the outer peripheral surface of the first annular member 731. Each injection hole 731H is formed to be opposite to the upper end of the corresponding lifting pin 723 and communicate with the inner space of the groove 731G and an outer space of the first annular member 731.

The gas supply system (not shown) is connected to the other end of the gas introduction pipe 733. The gas supplied from the gas supply system to the gas introduction pipe 733 is respectively injected from the plurality of injection holes 731H to the upper ends of the plurality of lifting pins 723 through inner spaces of the through hole 732H of the second annular member 732 and the inner space of the groove 731G of the first annular member 731. As the gas supplied to the gas introduction pipe 733, an inert gas such as a nitrogen gas is used.

(7) Cleaning Processing for Substrate by Cleaning Drying Processing Unit

A series of operations of the cleaning drying processing unit SD1 of when the cleaning processing for the substrate W is performed is described. FIGS. 11 to 18 are side views for explaining the cleaning processing for the substrate W in the cleaning drying processing unit SD1. In the following description, the height lower than the upper end of the lower spin chuck 400 by a constant distance is referred to as the height L1. Further, the predetermined height between the lower spin chuck 400 and the upper spin chuck 600 is referred to as the height L2. Further, the height at which the substrate W can be held by the upper spin chuck 600 is referred to as the L3.

Figure 11:
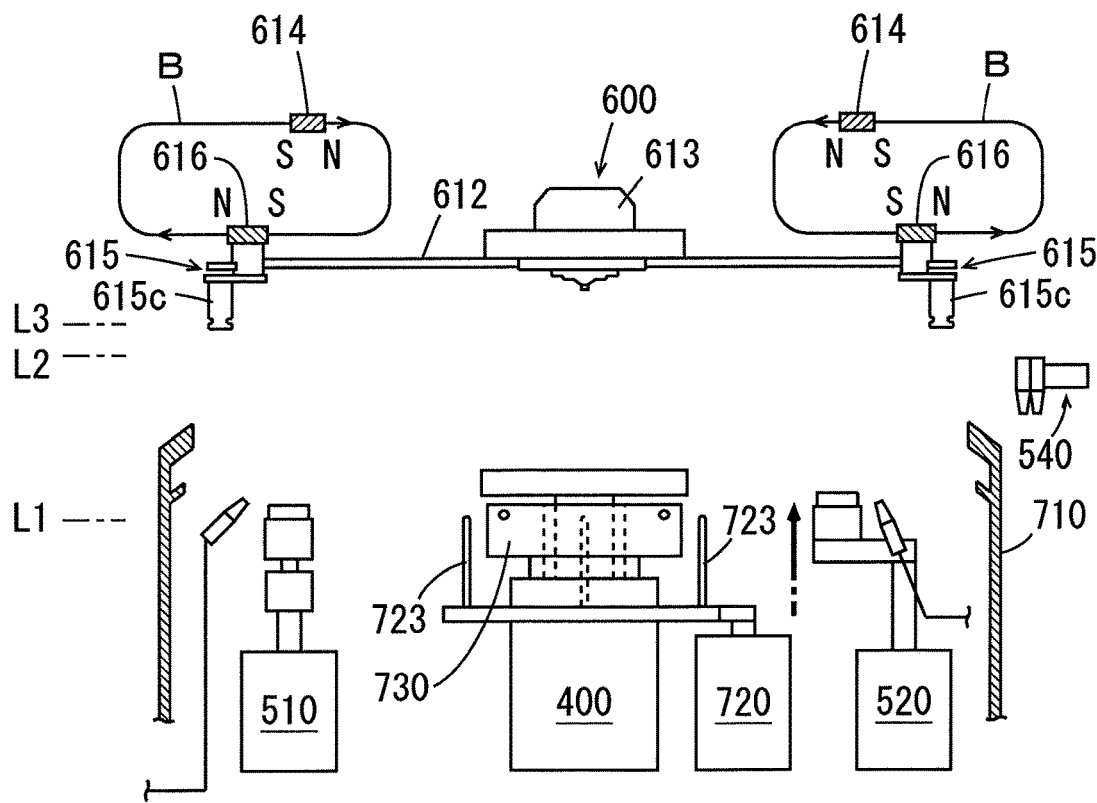
FIG. 11 is a side view for explaining cleaning processing for a substrate by the cleaning drying processing unit.

As shown in FIG. 11, in an initial state, the upper end of the guard 710 is held at a position lower than the upper spin chuck 600 and higher than the lower spin chuck 400. Further, the magnet plate 614 of the upper spin chuck 600 is at an upper position. In this case, a line of magnetic force B of the magnet plate 614 is directed outward at the height of the magnet 616 of each chuck pin 615. Thus, the S pole of the magnet 616 of each chuck pin 615 is attracted inward. Therefore, each chuck pin 615 enters the open state. Further, the upper ends of the plurality of lifting pins 723 of the receiving transferring mechanism 720 are held at the height L1.

Figure 12:
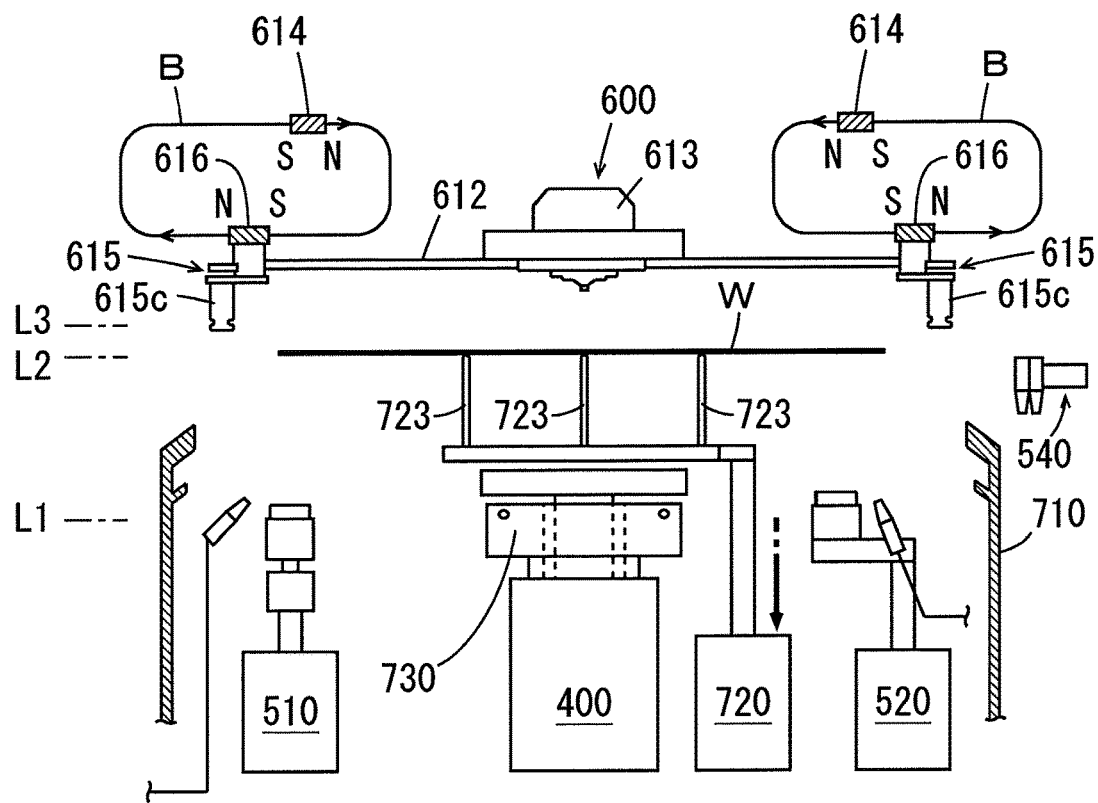
FIG. 12 is a side view for explaining the cleaning processing for the substrate by the cleaning drying processing unit.

As indicated by a thick one-dot and dash arrow in FIG. 11, when the substrate W is carried into the cleaning drying processing unit SD1, the plurality of lifting pins 723 are moved upward. As shown in FIG. 12, the upper ends of the plurality of lifting pins 723 are held at the height L2. In this state, the substrate W is placed on the plurality of lifting pins 723 by the transport mechanism 141 of FIG. 1.

Figure 13:
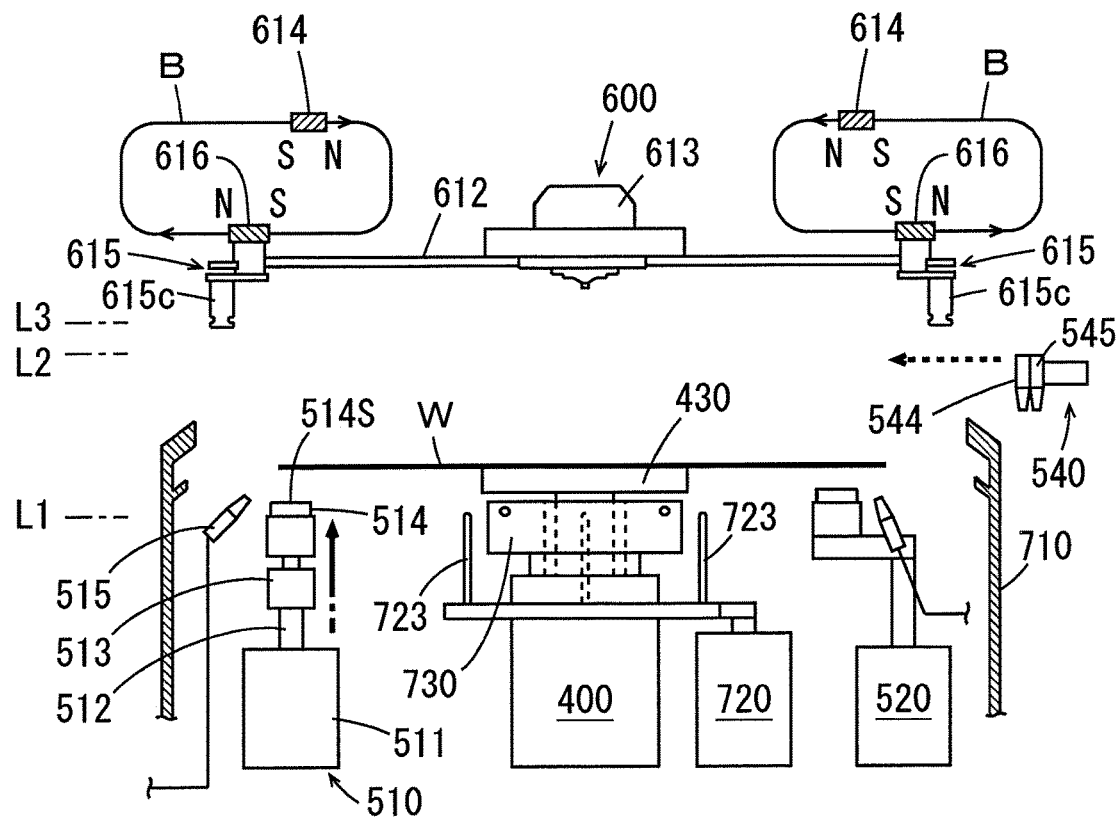
FIG. 13 is a side view for explaining the cleaning processing for the substrate by the cleaning drying processing unit.

Next, as indicated by a thick one-dot and dash arrow shown in FIG. 12, the plurality of lifting pins 723 are moved downward. Thus, as shown in FIG. 13, the substrate W is transferred from the plurality of lifting pins 723 onto the suction holder 430. At this time, the center of the substrate W is positioned to coincide with the rotational center WC of the suction holder 430 (FIG. 6) in the horizontal plane. Thereafter, the center portion of the back surface of the substrate W is held by the lower spin chuck 400, and the substrate W is rotated. The upper ends of the plurality of lifting pins 723 of the receiving transferring mechanism 720 are held at the height L1.

Next, as indicated by a thick one-dot and dash arrow in FIG. 13, the brush 514 of the first back surface cleaning mechanism 510 is moved upward. Further, as indicated by a thick dotted line in FIG. 13, the nozzles 544, 545 of the surface cleaning mechanism 540 are moved to positions directly upward of the substrate W from positions outward of the lower spin shuck 400.

Figure 14:
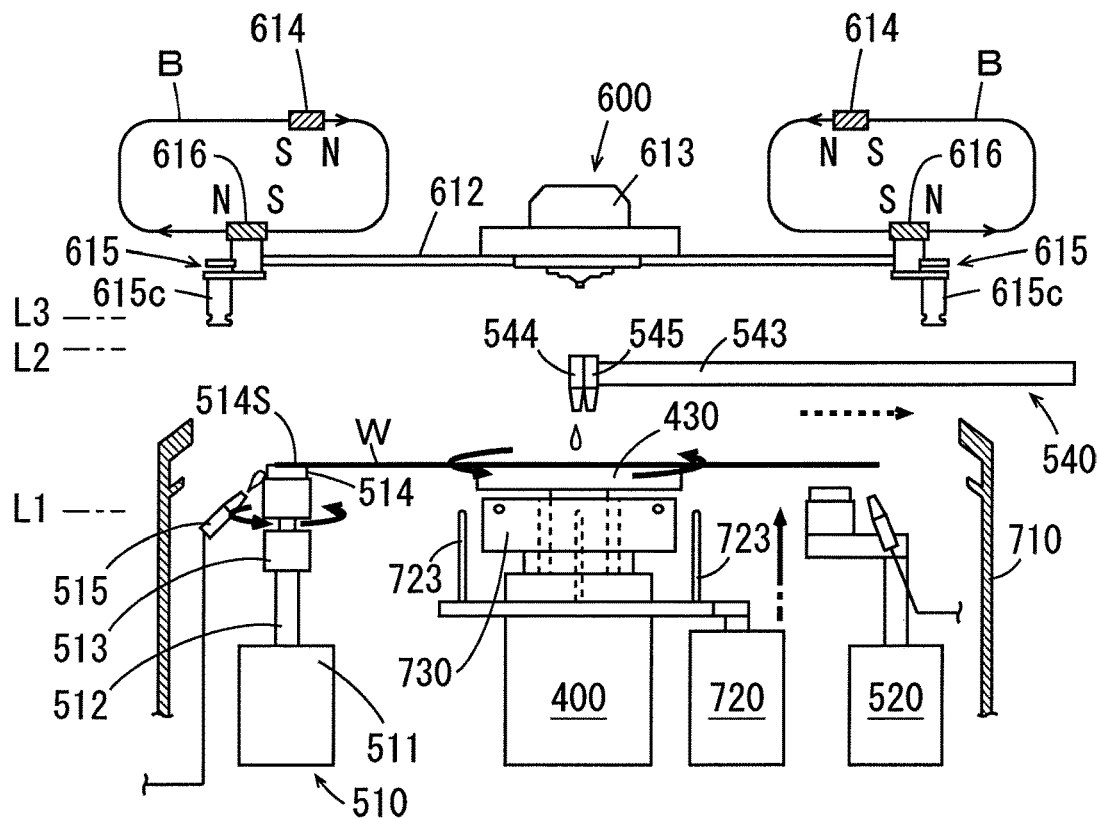
FIG. 14 is a side view for explaining the cleaning processing for the substrate by the cleaning drying processing unit.

As shown in FIG. 14, the cleaning surface 514S of the brush 514 comes into contact with the peripheral portion of the back surface of the substrate W. At this time, the brush 514 is pressed against the back surface of the substrate W by pressure based on a predetermined cleaning condition. Further, the brush 514 is rotated by the brush motor 513. Further, the cleaning liquid is discharged from the nozzle 515 at the brush 514. Thus, a contaminant at the peripheral portion of the back surface of the substrate W is removed by the brush 514. Further, the contaminant removed by the brush 514 is cleaned away by the cleaning liquid. Therefore, re-adherence of the contaminant to the substrate W is prevented, and a reduction in cleanliness of the brush 514 is inhibited.

At this time, part of the cleaning surface 514S of the brush 514 comes into contact with the outer peripheral end of the substrate W. Thus, the peripheral portion of the back surface and the outer peripheral end of the substrate W are simultaneously cleaned without another brush.

Further, the nozzle 544 of the surface cleaning mechanism 540 is held at a position directly upward of the center of the substrate W. In this state, the cleaning liquid is discharged from the nozzle 544 at the surface of the rotating substrate W. Thus, the surface of the substrate W is cleaned.

When the cleaning for the peripheral portion of the back surface of the substrate W, the outer peripheral end of the substrate W and the surface of the substrate W ends, the first back surface cleaning mechanism 510 is returned to the initial state. Specifically, in the first back surface cleaning mechanism 510, the rotation of the brush motor 513 is stopped, the discharge of the cleaning liquid from the nozzle 515 at the brush 514 is stopped, and the brush 514 is moved downward.

On the other hand, in the surface cleaning mechanism 540, the discharge of the cleaning liquid from the nozzle 544 at the substrate W is stopped, and the nozzle 545 is held at a position directly upward of the center of the substrate W. In this state, the gas is discharged from the nozzle 545 at the surface of the substrate W. Thus, the surface of the substrate W is dried.

As indicated by the thick dotted line in FIG. 14, when the back surface and the surface of the substrate W are dried, the nozzles 544, 545 of the surface cleaning mechanism 540 are moved from the positions directly upward of the substrate W to the positions outward of the lower spin chuck 400. Further, the rotation of the substrate W is stopped. Further, the suction of the substrate W is stopped in the lower spin chuck 400.

Figure 15:
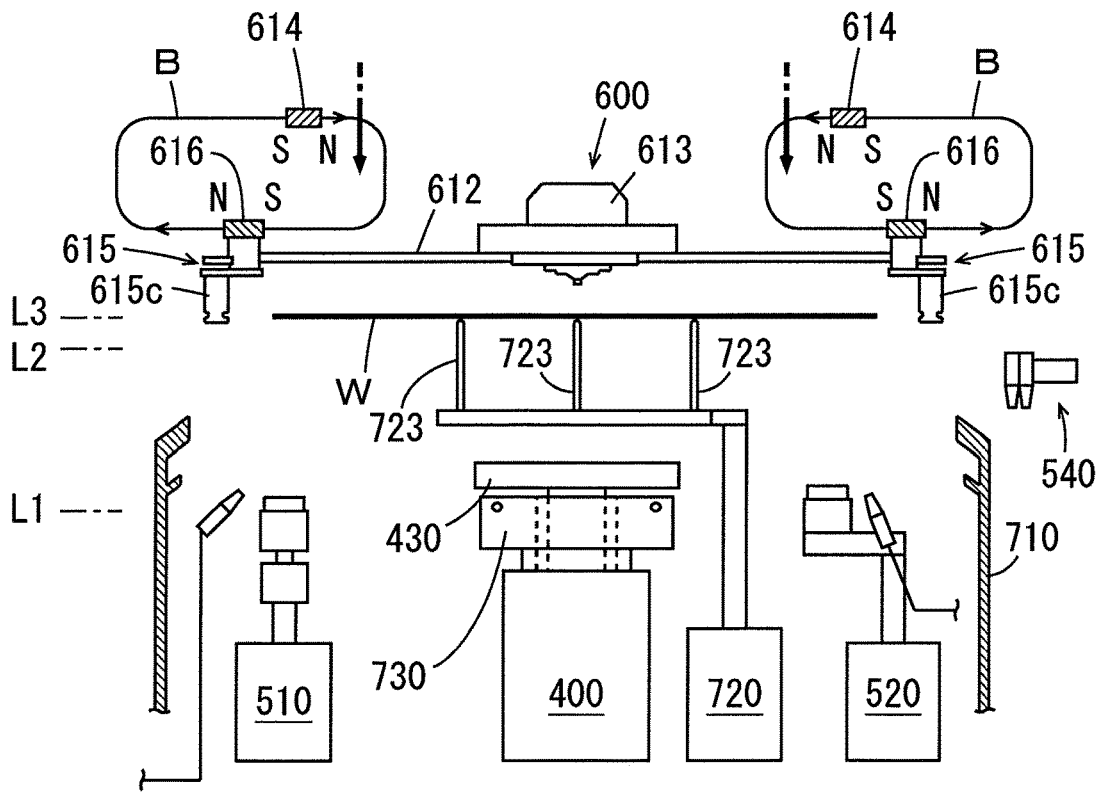
FIG. 15 is a side view for explaining the cleaning processing for the substrate by the cleaning drying processing unit.

Next, as indicated by a thick one-dot and dash arrow in FIG. 14, the plurality of lifting pins 723 are moved upward. Thus, as shown in FIG. 15, the substrate W is transferred from the suction holder 430 of the lower spin chuck 400 onto the plurality of lifting pins 723. Thereafter, the upper ends of the plurality of lifting pins 723 are held at the height L3. At this time, the substrate W is located among the holders 615c of the plurality of chuck pins 615 of the upper spin chuck 600.

Next, as indicated by a thick one-dot and dash arrow in FIG. 15, the magnet plate 614 of the upper spin chuck 600 is moved to a lower position. In this case, the N poles of the magnets 616 of the plurality of chuck pins 615 are attracted inward. Thus, each chuck pin 615 enters the close state, and each holder 615c abuts against the outer peripheral end of the substrate W. Thus, as shown in FIG. 16, the outer peripheral end of the substrate W is held by the holders 615c of the plurality of chuck pins 615.

Figure 16:
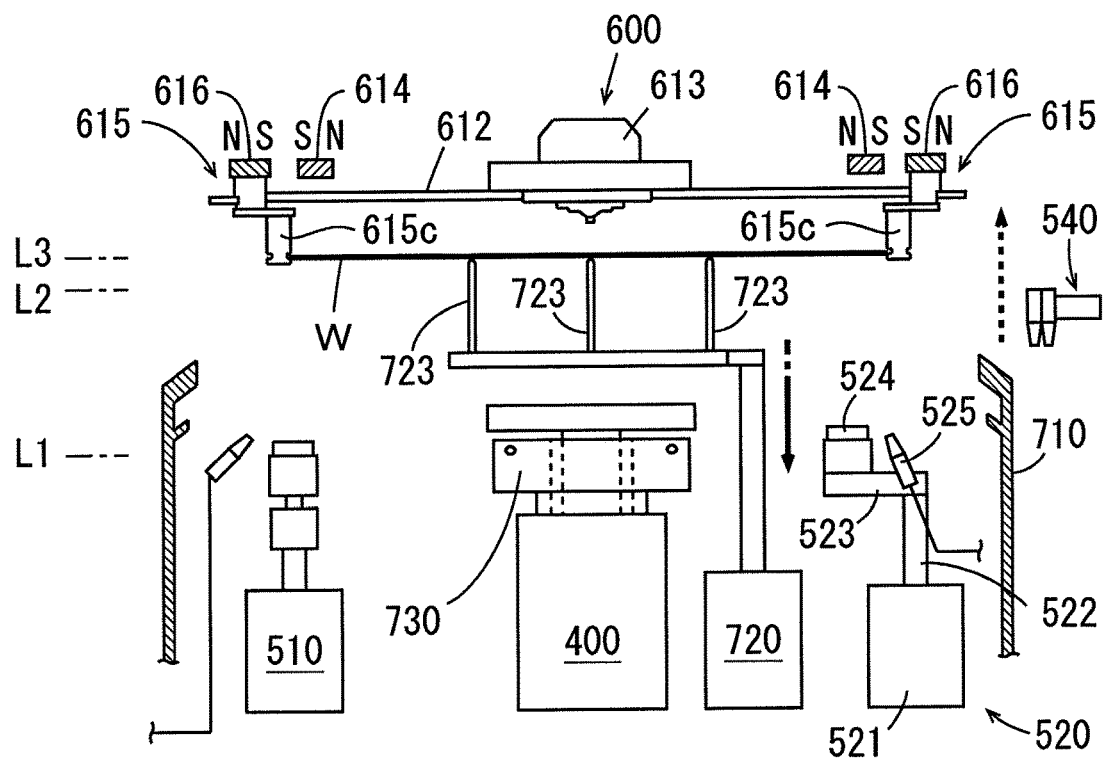
FIG. 16 is a side view for explaining the cleaning processing for the substrate by the cleaning drying processing unit.
Figure 17:
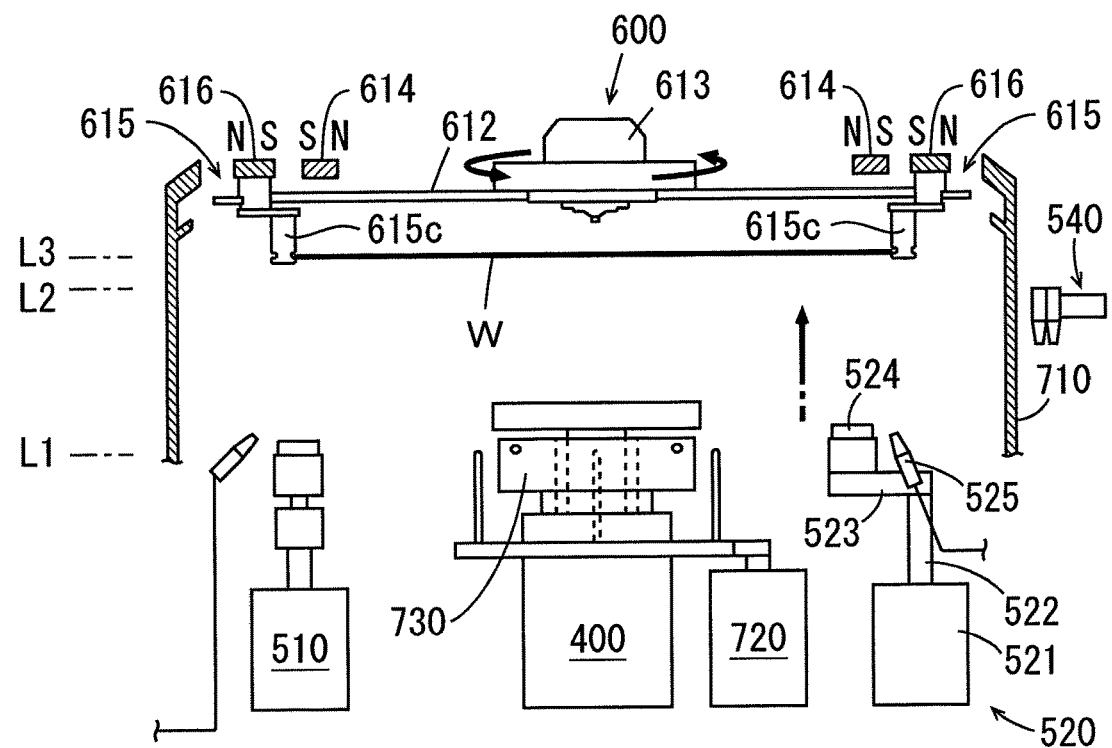
FIG. 17 is a side view for explaining the cleaning processing for the substrate by the cleaning drying processing unit.

Thereafter, as indicated by a thick one-dot and dash arrow in FIG. 16, the plurality of lifting pins 723 are moved downward. Further, as indicated by a thick dotted arrow in FIG. 16, the guard 710 is moved upward. As shown in FIG. 17, the upper ends of the plurality of lifting pins 723 are held at the height L1. Further, the guard 710 is moved to a height at which the guard 710 surrounds the substrate W held by the upper spin chuck 600. In this state, the substrate W is rotated.

Figure 18:
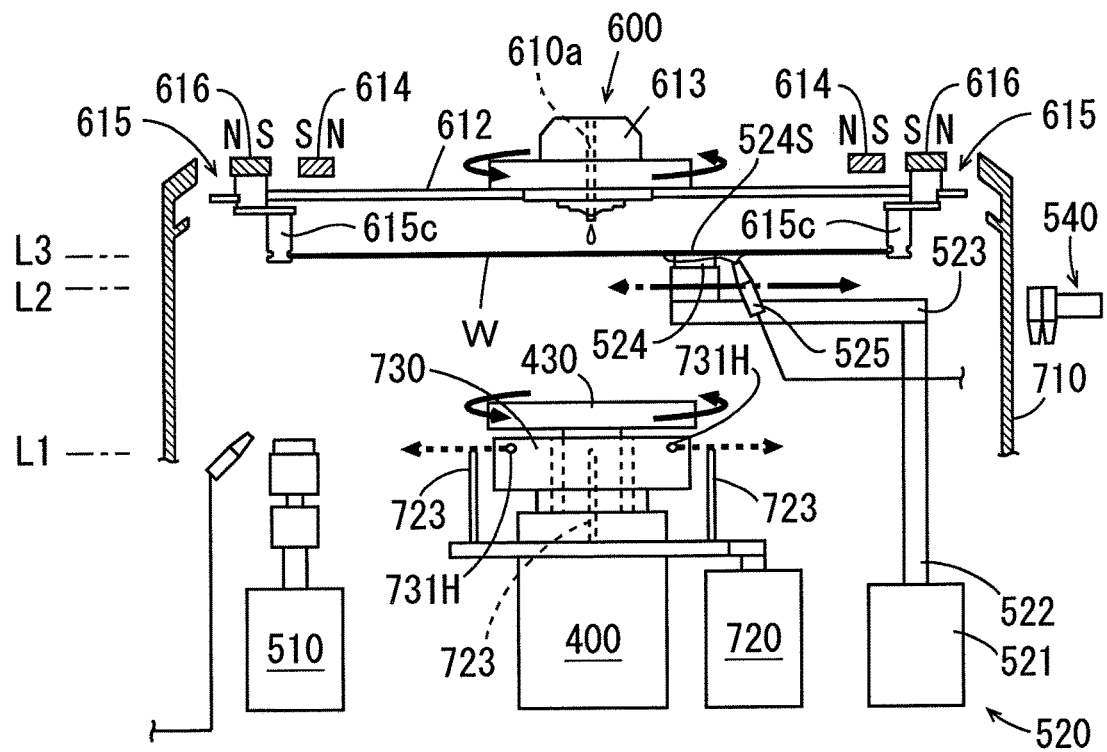
FIG. 18 is a side view for explaining the cleaning processing for the substrate by the cleaning drying processing unit.

Next, as indicated by a thick one-dot and dash arrow in FIG. 17, the brush 524 of the second back surface cleaning mechanism 520 is moved upward. As shown in FIG. 18, the cleaning surface 524S of the brush 524 comes into contact with a region inward of the peripheral portion of the back surface of the substrate W. At this time, the brush 524 is pressed against the back surface of the substrate W by the pressure based on the predetermined cleaning condition. Further, the cleaning liquid is discharged from the nozzle 525 at the brush 524. Further, as indicated by thick one-dot and dash lines in FIG. 18, the brush 524 is moved between the center of the substrate W and a portion located inward of the outer peripheral end of the substrate W by a constant distance. Thus, a contaminant in a region inward of the peripheral portion of the back surface of the substrate W is removed by the brush 524. Further, the contaminant removed by the brush 524 is cleaned away by the cleaning liquid. Therefore, re-adherence of the contaminant to the substrate W is prevented, and a reduction in cleanliness of the brush 524 is inhibited.

At this time, the contaminant removed by the brush 524 and the cleaning liquid supplied to the brush 524 fall on the suction holder 430 of the lower spin chuck 400. In the present embodiment, during the cleaning for the back surface of the substrate W by the second back surface cleaning mechanism 520, the suction holder 430 is rotated. Thus, the contaminant and the cleaning liquid that fall on the suction holder 430 are shaken off from the suction holder 430 by a centrifugal force. Therefore, adherence of the contaminant to the suction holder 430 is inhibited.

Further, as described above, each of the plurality of suction paths 436 (FIG. 9) formed in the suction holder 430 is formed to obliquely extend upward from the upper end of the rotation shaft 420. Thus, even if the contaminant and the cleaning liquid that fall on the suction holder 430 enter the openings 437 of the plurality of suction paths 436 (FIG. 10) as foreign matter, the foreign matter is discharged from the plurality of suction paths 436 by the centrifugal force by the rotation of the suction holder 430. Therefore, entrance of the foreign matter to the inside of the spin motor 410 is prevented.

Further, in the present embodiment, during cleaning for the back surface of the substrate W by the second back surface cleaning mechanism 520, the gas is injected from the plurality of injection holes 731H of the gas injection mechanism 730 to the upper ends of the plurality of lifting pins 723. Thus, the contaminant and the cleaning liquid that fall on the upper ends of the plurality of lifting pins 723 are blown away by the gas. Therefore, the contaminant and the cleaning liquid do not adhere to the upper ends of the plurality of lifting pins 723. As a result, when the substrate W is supported by the receiving transferring mechanism 720, transfer of the contaminant from the upper ends of the plurality of lifting pins 723 to the back surface of the substrate W is prevented.

During back surface cleaning for the substrate W by the second back surface cleaning mechanism 520, the cleaning liquid may be supplied to the upper surface of the substrate W through the liquid supply pipe 610a of the upper spin chuck 600. In this case, the surface of the substrate W is cleaned together with a region inward of the peripheral portion of the back surface of the substrate W.

The back surface cleaning for the substrate W by the second back surface cleaning mechanism 520 ends, so that the second back surface cleaning mechanism 520 returns to the initial state. Further, after the back surface of the substrate W is dried, the rotation of the substrate W by the upper spin chuck 600 is stopped. Further, the rotation of the suction holder 430 is stopped, and an injection operation of the gas by the gas injection mechanism 730 is stopped. Further, the substrate W held by the upper spin chuck 600 is transferred onto the plurality of lifting pins 723 of the receiving transferring mechanism 720 by the step opposite to the above-mentioned step. Finally, the cleaned substrate W is received by the transport mechanism 141 of FIG. 1 and is carried out from the cleaning drying processing unit SD1.

(8) Cleaning Processing for Suction Holder in Cleaning Drying Processing Unit

In the lower spin chuck 400 of the cleaning drying processing unit SD1, in a case in which a contaminant adheres to an upper surface of the suction holder 430, the contaminant is transferred to the center portion of the back surface of the substrate W when the substrate W is held by the lower spin chuck 400. In the substrate processing apparatus 100 according to the present embodiment, the upper surface of the suction holder 430 is cleaned every time the predetermined number of substrates W are processed or every lot, for example.

Figure 19:
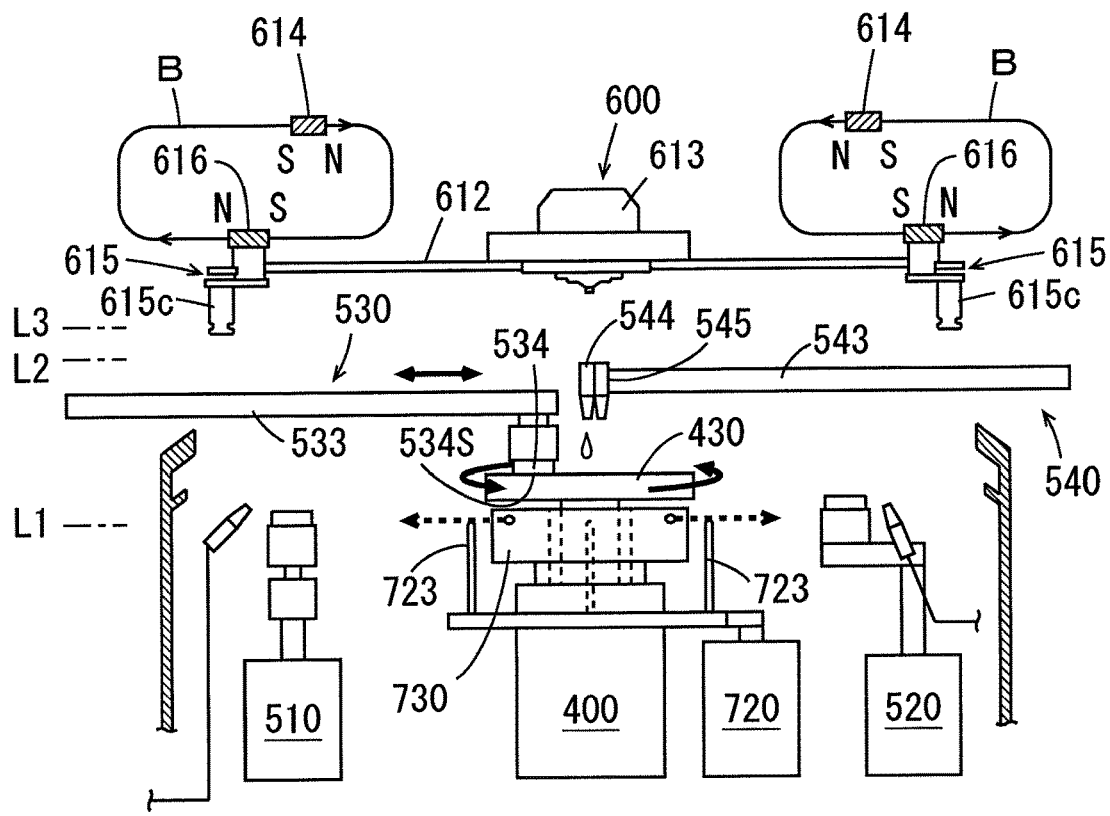
FIG. 19 is a side view for explaining cleaning processing for a suction holder in the cleaning drying processing unit.

FIG. 19 is a side view for explaining the cleaning processing for the suction holder 430 in the cleaning drying processing unit SD1. As shown in FIG. 19, during the cleaning processing for the suction holder 430, the upper ends of the plurality of lifting pins 723 are held at the height L1. Further, the gas is injected to the upper ends of the plurality of lifting pins 723 from the gas injection mechanism 730.

Further, the suction holder 430 of the lower spin chuck 400 is rotated. In this state, the cleaning surface 534S of the brush 534 of the spin chuck cleaning mechanism 530 comes into contact with the upper surface of the suction holder 430. At this time, the brush 534 is pressed against the upper surface of the suction holder 430 by the pressure based on the predetermined cleaning condition. Further, the nozzle 544 of the surface cleaning mechanism 540 is moved to be located directly upward of the suction holder 430. Further, the cleaning liquid is discharged from the nozzle 544 such that the cleaning liquid is supplied to the brush 534 on the suction holder 430.

In this state, the brush 534 of the spin chuck cleaning mechanism 530 is moved between the rotational center WC of the suction holder 430 (FIG. 6) and the outer peripheral end. Thus, the contaminant adhering to the upper surface of the suction holder 430 is removed by the brush 534. Therefore, transfer of the contaminant from the suction holder 430 to the center portion of the back surface of the substrate W is prevented.

Further, the removed contaminant is cleaned away by the cleaning liquid, so that re-adherence of the removed contaminant to the suction holder 430 is prevented. Thus, the cleanliness of the suction holder 430 after the cleaning is improved. Further, a reduction in cleanliness of the brush 534 is inhibited.

The brush 534 does not have to be used during cleaning for the suction holder 430. For example, the cleaning liquid may be discharged from the nozzle 544 of the surface cleaning mechanism 540 at the upper surface of the rotating suction holder 430 such that the suction holder 430 is cleaned. In this case, the contaminant adhering to the upper surface of the suction holder 430 is cleaned away by the cleaning liquid supplied from the nozzle 544. Therefore, transfer of the contaminant from the suction holder 430 to the center portion of the back surface of the substrate W is prevented. In this case, it is not necessary to provide the spin chuck cleaning mechanism 530.

(9) Effects

FIG. 20 is a plan view showing a relationship between a holding position and a cleaning position of the substrate W in the cleaning drying processing unit SD1. In FIG. 20, the center portion, of the back surface of the substrate W, that is sucked by the suction holder 430 of the lower spin chuck 400 is indicated by a thick one-dot and dash line. Further, portions, of the outer peripheral end of the substrate, which abut against the plurality of chuck pins 615 of the upper spin chuck 600 are indicated by outlined arrows. Further, a region R1 at the peripheral portion of the back surface cleaned by the brush 514 of the first back surface cleaning mechanism 510 is indicated by a dotted pattern, and a region R2 inward of the peripheral portion of the back surface cleaned by the brush 524 of the second back surface cleaning mechanism 520 is indicated by hatching. In the present embodiment, a width D1 of the region R1 is set to not less than 10 mm and not more than 25 mm, for example.

Further, in FIG. 20, the first back surface cleaning mechanism 510, the second back surface cleaning mechanism 520 and the plurality of chuck pins 615 of the upper spin chuck 600 are indicated by dotted lines in order to facilitate understanding of a positional relationship among the constituent elements in the horizontal plane.

As described above, the suction holder 430 of the lower spin chuck 400 sucks the center portion of the back surface of the substrate W, so that the substrate W is held. In this state, the region R1 at the peripheral portion of the back surface of the substrate W rotated by the spin motor 410 of FIG. 5 is cleaned by the brush 514 of the first back surface cleaning mechanism 510. In this case, as shown in FIG. 20, the holding position of the substrate W by the suction holder 430 and the cleaning position of the substrate W by the brush 514 are spaced apart from each other, so that the suction holder 430 and the brush 514 do not interfere with each other. Thus, it is not necessary to change the holding position of the substrate W in order to prevent the suction holder 430 and the brush 514 from interfering with each other. Further, a positional deviation of the substrate W due to the change of the holding position does not occur either. Therefore, the region R1 at the peripheral portion of the back surface of the substrate W can be evenly cleaned by the brush 514.

Further, the plurality of chuck pins 615 of the upper spin chuck 600 abut against the outer peripheral end of the substrate W, so that the substrate W is held. In this state, the region R2 inward of the peripheral portion of the back surface of the substrate W that is rotated by the spin motor 611 of FIG. 5 is cleaned by the brush 524 by the second back surface cleaning mechanism 520. In this case, as shown in FIG. 20, the holding position of the substrate W by the plurality of chuck pins 615 and the cleaning position of the substrate W by the brush 524 are spaced apart from each other, so that the plurality of chuck pins 615 and the brush 524 do not interfere with each other. Thus, it is not necessary to change the holding position of the substrate W in order to prevent the plurality of chuck pins 615 and the brush 524 from interfering with each other. Further, a positional deviation of the substrate W due to the change of the holding position does not occur either. Therefore, a region R2 inward of the peripheral portion of the back surface of the substrate W can be evenly cleaned by the brush 524.

Receiving and transferring of the substrate W are performed by the receiving transferring mechanism 720 of FIG. 5 between the lower spin chuck 400 and the upper spin chuck 600. Thus, the entire back surface of the substrate W can be evenly cleaned by the brush 514 of the first back surface cleaning mechanism 510 and the brush 524 of the second back surface cleaning mechanism 520.

(10) Other Embodiments (10-1) While a region cleaned by the brush 524 of the second back surface cleaning mechanism 520 is set inward of the peripheral portion of the back surface of the substrate W cleaned by the brush 514 of the first back surface cleaning mechanism 510 in the above-mentioned embodiment, the present invention is not limited to this. The region cleaned by the brush 524 of the second back surface cleaning mechanism 520 only have to include a region inward of the peripheral portion of the back surface of the substrate W. Therefore, part of the region cleaned by the brush 514 of the first back surface cleaning mechanism 510 and part of the region cleaned by the brush 524 of the second back surface cleaning mechanism 520 may be set to overlap with each other.

(10-2) In the cleaning processing for the substrate described in the above-mentioned embodiment, the region inward of the peripheral portion of the back surface of the substrate W is cleaned after the peripheral portion of the back surface and the outer peripheral end of the substrate W are cleaned. However, the present invention is not limited to this. Depending on the cleaning condition of the substrate W, the peripheral portion of the back surface and the outer peripheral end of the substrate W may be cleaned after the region inward of the peripheral portion of the back surface of the substrate W is cleaned.

(10-3) While the cleaning liquid is supplied to the brush 514 during the cleaning for the peripheral portion of the back surface of the substrate W in the above-mentioned embodiment, the present invention is not limited to this. Depending on the cleaning condition for the substrate W, the cleaning liquid does not have to be supplied to the brush 514 during the cleaning for the substrate W by the brush 514. In this case, it is not necessary to provide the nozzle 515.

(10-4) While the cleaning liquid is supplied to the brush 524 during the cleaning for the region inward of the peripheral portion of the back surface of the substrate W in the above-mentioned embodiment, the present invention is not limited to this. Depending on the cleaning condition of the substrate W, the cleaning liquid does not have to be supplied to the brush 524 during the cleaning for the substrate W by the brush 524. In this case, it is not necessary to provide the nozzle 525.

(10-5) While the brush 514 is rotated by the brush motor 513 during the cleaning for the peripheral portion of the back surface of the substrate W in the above-mentioned embodiment, the present invention is not limited to this. Depending on the cleaning condition of the substrate W, the brush 514 does not have to be rotated during the cleaning for the peripheral portion of the back surface of the substrate W. In this case, it is not necessary to provide the brush motor 513 in the first back surface cleaning mechanism 510.

(10-6) In the above-mentioned embodiment, part of the brush 514 is provided to come into contact with the outer peripheral end of the substrate W during the cleaning for the peripheral portion of the back surface of the substrate W, so that the peripheral portion of the back surface and the outer peripheral end of the substrate W are simultaneously cleaned. However, the present invention is not limited to this. In addition to the brush 514, another brush for cleaning only the outer peripheral end of the substrate W may be provided.

(10-7) In the above-mentioned embodiment, the brush 514 for cleaning the peripheral portion of the back surface and the outer peripheral end of the substrate W, and the brush 524 for cleaning the region inward of the peripheral portion of the back surface of the substrate W are individually provided. However, the present invention is not limited to this. For example, the brush 524 of the second back surface cleaning mechanism 520 may be commonly used for cleaning the peripheral portion of the back surface and the outer peripheral end of the substrate W and cleaning the region inward of the peripheral portion of the back surface of the substrate W both. In this case, the number of brushes used for cleaning the substrate W can be reduced.

(10-8) While the annular gas injection mechanism 730 is used in order to inject the gas to the upper ends of the plurality of lifting pins 723 in the above-mentioned embodiment, the present invention is not limited to the above-mentioned example. As a configuration for injecting the gas to the upper ends of the plurality of lifting pins 723, a plurality of gas injection nozzles capable of respectively injecting the gas to the upper ends of the plurality of lifting pins 723, for example, may be provided.

(10-9) While the nozzle that supplies the cleaning liquid to the brush 534 is not provided in the spin chuck cleaning mechanism 530 in the above-mentioned embodiment, the present invention is not limited to this. For example, a nozzle capable of discharging the cleaning liquid to the brush 534 may be provided at the arm 533 of the spin chuck cleaning mechanism 530.

(10-10) While a resist cover film is formed on the substrate W by the coating processing unit 129 in each of the coating processing chambers 32, 34 in the above-mentioned embodiment, the present invention is not limited to the above-mentioned example. When a water-resistant resist film is formed in each of the coating processing chambers 21, 23, the resist cover film does not have to be formed on the substrate W in each of the coating processing chambers 32, 34. When the resist cover film is not formed on the substrate W, another processing such as formation processing of the resist film or development processing may be performed in each of the coating processing chambers 32, 34.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the lower spin chuck 400 is an example of a first substrate holding device, the upper spin chuck 600 is an example of a second substrate holding device, the receiving transferring mechanism 720 is an example of a receiving transferring mechanism, the first back surface cleaning mechanism 510 is an example of a first cleaning mechanism, the second back surface cleaning mechanism 520 is an example of a second cleaning mechanism, the suction holder 430 is an example of a suction holder, the spin motor 410 is an example of a first rotation driver, and the brush 514 of the first back surface cleaning mechanism 510 is an example of a first brush.

Further, the spin plate 612 is an example of a rotation member, the spin motor 611 is an example of a second rotation driver, the plurality of chuck pins 615 are examples of a abutment holder, the brush 524 of the second back surface cleaning mechanism 520 is an example of a second brush, and the substrate processing apparatus 100 is an example of a substrate processing apparatus.

Further, the nozzle 515 of the first back surface cleaning mechanism 510 is an example of a first cleaning liquid supplier, the nozzle 525 of the second back surface cleaning mechanism 520 is an example of a second cleaning liquid supplier, the controller 114 is an example of a controller, the rotation shaft 420 is an example of a rotation shaft, and the plurality of suction paths 436 are examples of a suction path.

Further, the spin chuck cleaning mechanism 530 is an example of a third cleaning mechanism, the brush 534 of the spin chuck cleaning mechanism 530 is an example of a third brush, the surface cleaning mechanism 540 is an example of a fourth cleaning mechanism, the nozzle 544 of the surface cleaning mechanism 540 is an example of a third cleaning liquid supplier, the plurality of lifting pins 723 are examples of a receiving transferring supporter, and the gas injection mechanism 730 is an example of a gas injection device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing various types of substrates.

I claim:

1. A substrate processing apparatus comprising:
   a first substrate holding device that is disposed for holding a substrate at a first height;
   a second substrate holding device that is provided directly upward of the first substrate holding device and is thereby disposed for holding the substrate at a second height that is higher than the first height;
   a receiving transferring mechanism that receives and transfers the substrate between the first substrate holding device and the second substrate holding device; and
   first and second cleaning mechanisms that clean a lower surface of the substrate, wherein
   the first substrate holding device includes
   a suction holder that is configured to be rotatable about a vertical axis and sucks a center portion of the lower surface of the substrate, and
   a first rotation motor that rotates the suction holder about the vertical axis,
   the first cleaning mechanism includes a first brush that is disposed for cleaning a peripheral portion of the lower surface of the substrate that is rotated while being held at the first height by the suction holder,
   the second substrate holding device includes
   a rotation member configured to be rotatable about the vertical axis,
   a second rotation motor that rotates the rotation member about the vertical axis, and
   a plurality of abutment holders that hold the substrate by abutting against an outer peripheral end of the substrate that is arranged directly downward of the rotation member, and
   the second cleaning mechanism includes
   a second brush, and
   a second brush supporter that supports the second brush in a space between the suction holder of the first substrate holding device and the substrate held by the second substrate holding device such that a region inward of the peripheral portion of the lower surface of the substrate that is rotated while being held at the second height by the second substrate holding device is cleaned.

2. The substrate processing apparatus according to claim 1, wherein
   the first cleaning mechanism further includes a first cleaning liquid supplier that supplies a cleaning liquid to the first brush during cleaning for the peripheral portion of the lower surface using the first brush, and
   the second cleaning mechanism further includes a second cleaning liquid supplier that supplies the cleaning liquid to the second brush during cleaning for the region inward of the peripheral portion of the lower surface using the second brush.

3. The substrate processing apparatus according to claim 1, further comprising a controller that controls the first substrate holding device, the second substrate holding device, the first cleaning mechanism, the second cleaning mechanism and the receiving transferring mechanism, wherein
   the controller controls the first rotation motor such that the suction holder is rotated during cleaning for the lower surface of the substrate by the second cleaning mechanism.

4. The substrate processing apparatus according to claim 3, wherein
   the first rotation motor includes a hollow rotation shaft provided to extend upward,
   the suction holder has a suction path and is attached to an upper end of the rotation shaft, and
   the suction path is formed to obliquely extend upward from an inner space of the rotation shaft and be open to an upper surface of the suction holder.

5. The substrate processing apparatus according to claim 1, further comprising a third cleaning mechanism that has a third brush and cleans an upper surface of the suction holder by the third brush.

6. The substrate processing apparatus according to claim 1, further comprising a fourth cleaning mechanism that has a third cleaning liquid supplier and supplies a cleaning liquid to an upper surface of the suction holder from the third cleaning liquid supplier.

7. The substrate processing apparatus according to claim 1, wherein
   the receiving transferring mechanism includes a receiving transferring supporter configured to be movable in a vertical direction between the first substrate holding device and the second substrate holding device while supporting the substrate,
   the receiving transferring supporter has an upper end that supports the substrate by abutting against a region between the center portion of the lower surface and the peripheral portion of the lower surface of the substrate, and
   the substrate processing apparatus further includes a gas injection device that injects gas to the upper end of the receiving transferring supporter at a position directly downward of the second substrate holding device during cleaning for the lower surface of the substrate by the second cleaning mechanism.

8. The substrate processing apparatus according to claim 1, wherein
   the first brush is configured to be capable of cleaning an outer peripheral end by coming into contact with the outer peripheral end of the substrate that is rotated while being held by the first substrate holding device.

9. The substrate processing apparatus according to claim 1, wherein
   the second cleaning mechanism cleans the lower surface of the substrate cleaned by the first cleaning mechanism.

* * * * *